United States Patent
Liaw

(10) Patent No.: US 9,991,268 B1
(45) Date of Patent: Jun. 5, 2018

(54) SRAM CELL STRUCTURE

(71) Applicant: Taiwan Semiconductor Manufacturing Co., Ltd., Hsinchu (TW)

(72) Inventor: Jhon-Jhy Liaw, Zhudong Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/617,219

(22) Filed: Jun. 8, 2017

(51) Int. Cl.
| | | |
|---|---|---|
| H01L 27/00 | (2006.01) | |
| H01L 27/11 | (2006.01) | |
| H01L 29/423 | (2006.01) | |
| H01L 23/528 | (2006.01) | |
| H01L 27/02 | (2006.01) | |
| H01L 27/092 | (2006.01) | |
| H01L 29/51 | (2006.01) | |
| G11C 11/412 | (2006.01) | |

(52) U.S. Cl.
CPC ........ *H01L 27/1104* (2013.01); *G11C 11/412* (2013.01); *H01L 23/528* (2013.01); *H01L 27/0207* (2013.01); *H01L 27/0924* (2013.01); *H01L 29/42372* (2013.01); *H01L 29/517* (2013.01); *H01L 29/518* (2013.01)

(58) Field of Classification Search
None
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,251,888 B1 * | 2/2016 | Liaw | H01L 23/528 |
| 9,520,482 B1 | 12/2016 | Chang et al. | |
| 9,576,814 B2 | 2/2017 | Wu et al. | |

* cited by examiner

*Primary Examiner* — Reema Patel
(74) *Attorney, Agent, or Firm* — McClure, Qualey & Rodack, LLP

(57) ABSTRACT

A static random access memory (SRAM) cell and a SRAM cell structure are provided. The SRAM cell includes a first pull-down transistor, a first pull-up transistor, a second pull-down transistor, a second pull-up transistor, a first conductive line pattern and a second conductive line pattern. A first gate electrode pattern of the first pull-down transistor and a second gate electrode pattern of the first pull-up transistor are physically separated from each other and electrically connected to the first conductive line pattern. The second inverter includes a second pull-down transistor, a second pull-up transistor and a second conductive line pattern. A third gate electrode pattern of the second pull-down transistor and a fourth gate electrode pattern of the second pull-up transistor are physically separated from each other and electrically connected to the second conductive line pattern.

20 Claims, 13 Drawing Sheets

US 9,991,268 B1

SRAM CELL STRUCTURE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Static Random Access Memory (SRAM) is commonly used in integrated circuits. SRAM cells have the advantageous feature of being able to hold data without the need for refreshing. With the increasingly demanding requirements on the speed of integrated circuits, the read speed and write speed of SRAM cells have also become more important. With the increasing down-scaling of the already very small SRAM cells, however, such requests are difficult to achieve. For example, the sheet resistance of metal lines, which form the word-lines and bit-lines of SRAM cells, becomes higher, and hence the RC delay of the word lines and bit-lines of SRAM cells is increased, preventing any substantial improvements in the read speed and write speed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
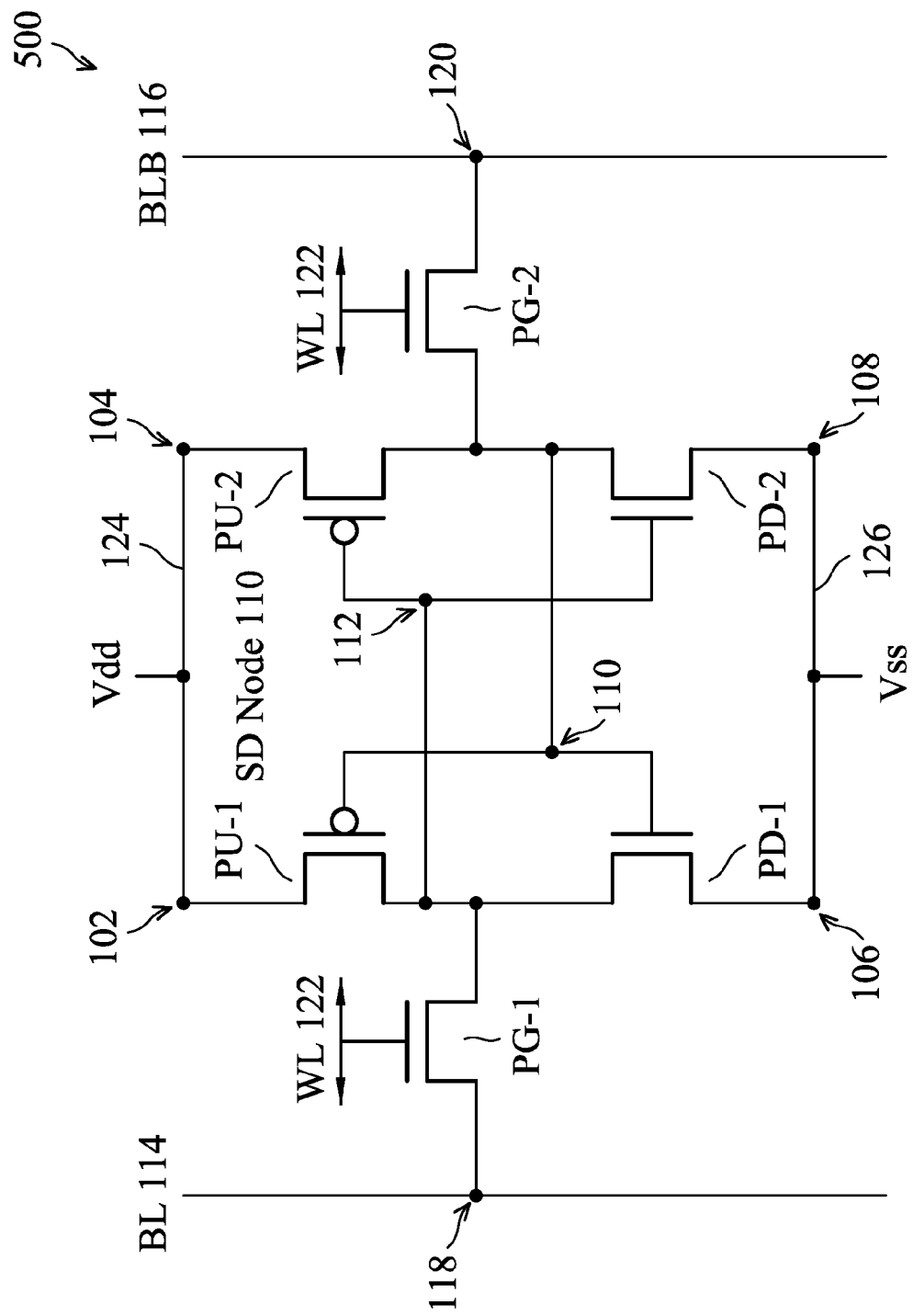
FIGS. 1 and 2 illustrate circuit diagrams of a static random access memory (SRAM) cell in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

A static random access memory (SRAM) cell and the corresponding SRAM cell structure (e.g. a SRAM array) are provided in accordance with various exemplary embodiments. Some variations of some embodiments are discussed. Throughout the various views and illustrative embodiments, like reference numbers are used to designate like elements.

FIG. 1 illustrates a circuit diagram of SRAM cell 500 in accordance with some embodiments. In some embodiments, the SRAM cell 500 includes pass-gate transistors PG-1 and PG-2, pull-up transistors PU-1 and PU-2 and pull-down transistors PD-1 and PD-2. The pass-gate transistors PG-1 and PG-2 and pull-up transistors PU-1 and PU-2 are p-type metal-oxide-semiconductor (PMOS) transistors. The pull-down transistors PD-1 and PD-2 are n-type metal-oxide-semiconductor (NMOS) transistors. The gates of the pass-gate transistors PG-1 and PG-2 are connected to, and controlled by, a word-line (WL) 122 that determines whether SRAM cell 500 is selected or not. A latch formed of the pull-up transistors PU-1 and PU-2 and the pull-down transistors PD-1 and PD-2 stores a bit, and the complementary values of the bit are stored in storage node 110 and storage node 112. The stored bit can be written into, or read from, the SRAM cell 500 through a bit-line (BL) 114 and a bit-line Bar (BLB) 116. In addition, the BL 114 and the BLB 116 may carry complementary bit-line signals. In some embodiments, the SRAM cell 500 is powered through a positive power supply node Vdd that has a positive power supply voltage (also denoted as Vdd). The SRAM cell 500 is also connected to power supply voltage Vss (also denoted as Vss), which may be an electrical ground. In some embodiments, the pull-up transistor PU-1 and the pull-down transistor PD-1 collectively form a first inverter. The pull-up transistor PU-2 and the pull-down transistor PD-2 may collectively form a second inverter. The input of the first inverter is connected to the pass-gate transistor PG-1 and the output of the second inverter. In addition, the output of the first inverter is connected to pass-gate transistor PG-2 and the input of the second inverter.

The sources of the pull-up transistors PU-1 and PU-2 are connected to a power supply voltage-node (CVdd-node) 102 and a CVdd-node 104, respectively, which are further connected to power supply voltage Vdd through a power supply voltage (CVdd) line 124. The power supply voltage Vdd may be carried by a metal line. The sources of the pull-down transistors PD-1 and PD-2 are connected to a power supply voltage-node (CVss-node) 106 and a CVss-node 108, respectively, which are further connected to power supply voltage Vss through a power supply voltage (CVss) line 126. The power supply voltage Vss may be carried by a metal line. The gates of the pull-up transistor PU-1 and the pull-down transistor PD-1 are connected to the drains of the pull-up transistor PU-2 and the pull-down transistor PD-2, which connection node is the storage node 110. The gates of the pull-up transistor PU-2 and the pull-down transistor PD-2 are connected to the drains of the pull-down transistor PU-1 and the pull-down transistor PD-1, which connection node is the storage node 112. A source/drain region of the pass-gate transistor PG-1 is connected to the bit-line (BL) 114 at a bit-line node 118. A source/drain region of the pass-gate transistor PG-2 is connected to the bit-line bar (BLB) 116 at a bit-line bar node 120.

Figure 2:
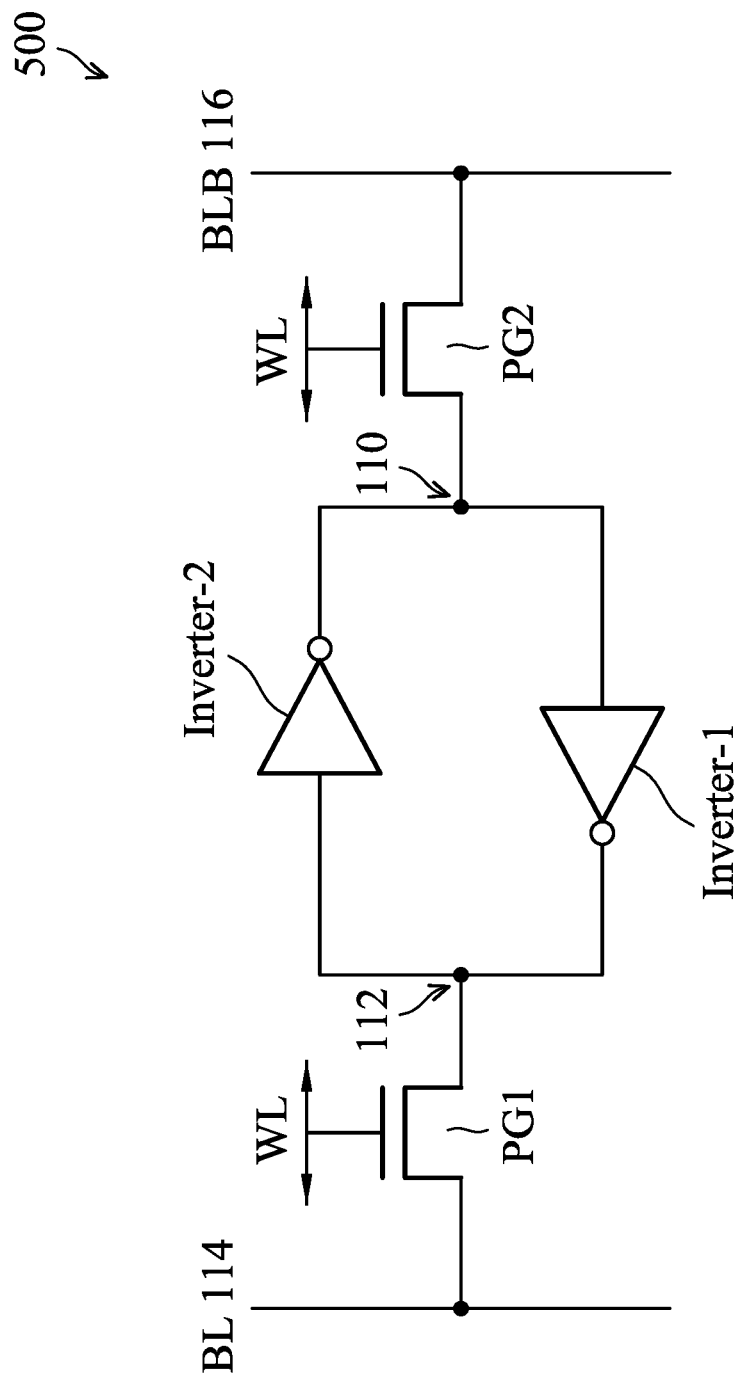

FIG. 2 illustrates an alternative circuit diagram of the SRAM cell 500 in accordance with some embodiments. In some embodiments, the pull-up transistor PU-1 and the pull-down transistor PD-1 shown in FIG. 1 are represented as a first inverter Inverter-1. In addition, the pull-up transistor PU-2 and the pull-down transistor PD-2 are represented as a second inverter Inverter-2. In some embodiments, the second inverter Inverter-2 is cross-latched with the first inverter Inverter-1. More specifically, the output of the first inverter Inverter-1 is connected to the pass-gate transistor PG-1 and the input of the second inverter Inverter-2. The output of the second inverter Inverter-2 is connected to the pass-gate transistor PG-2 and the input of the second inverter Inverter-2.

Figure 3:
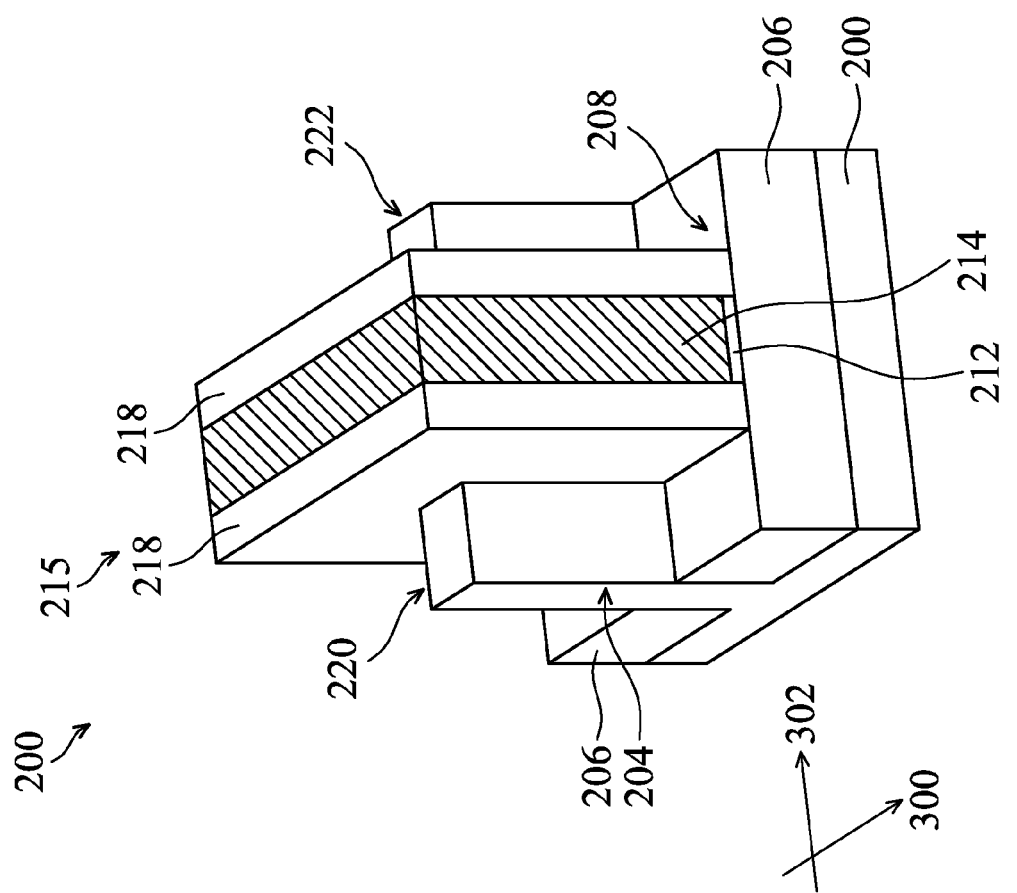
FIG. 3 is a perspective view of a fin field-effect transistor (FinFET) in accordance with some embodiments.

FIG. 3 illustrates a perspective view of a fin field effect transistor (FinFET) 250, which may serve as any of the transistors in the SRAM cell 500, including the pull-up transistor PU-1, the pull-up transistor PU-2, the pull-down transistor PD-1, the pull-down transistor PD-2, the pass-gate transistor PG-1, and the pass-gate transistor PG-2. In some embodiments, the FinFET 250 includes a semiconductor fin 204, a gate structure 215, spacers 218, a drain region 220 and a source region 222. The semiconductor fin 204 extends above a semiconductor substrate 200. In some embodiments, the semiconductor substrate 200 and the semiconductor fin 204 are made of the same material. For example, the substrate is a silicon substrate. In some instances, the substrate includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, the substrate is a silicon on insulator (SOI) layer substrate or a silicon on sapphire (SOS) substrate. In some embodiments, the semiconductor substrate 200 and the semiconductor fin 204 are made of different materials.

In some embodiments, the semiconductor fin 204 of the FinFET 250 may be surrounded by isolating features 206 formed on opposite sides of the semiconductor fin 204. The isolating features 206 may electrically isolate an active region (not shown) of the FinFET 250 from other active regions. In some embodiments, the isolating features 206 are shallow trench isolation (STI), field oxide (FOX), or another suitable electrically insulating structure. In some embodiments, the semiconductor fin 204 represents the semiconductor fins 204-1, 204-2, 204-3 and 204-4 (FIGS. 5A-5D and 6A-6D) throughout the layouts of the present disclosure.

In some embodiments, the gate structure 215, which includes a gate dielectric 212 and a gate electrode 214 formed over the gate dielectric 212, is positioned over sidewalls and a top surface of the semiconductor fin 204. Therefore, a portion of the semiconductor fin 204 overlaps the gate structure 215 may serve as a channel region of the FinFET 250. In some embodiments, the channel region of p-type FinFETs, for example, the pull-up transistor PU-1 and the pull-up transistor PU-2, the channel region include a SiGe channel region. In addition, the Ge concentration in the SiGe channel region is in a range from about 10 at % to about 40 at %. In some embodiments, the gate dielectric 212 is a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate electrode 214 is made of a conductive material, such as aluminum (Al), copper (Cu), tungsten (W), titanium (Ti), tantalum (Ta), or another applicable material.

In some embodiments, the spacers 218 of the FinFET 250 are positioned over sidewalls and a top surface of the semiconductor fin 204. In addition, the spacers 218 may be formed on opposite sides of the gate structure 215. In some embodiments, the spacers 218 are made of silicon nitride, silicon oxynitride, silicon carbide, another suitable material, or a combination thereof.

In some embodiments, portions of the semiconductor fin 204 that are not covered by the gate structure 215 and the spacers 218 serve as a drain region 220 and a source region 222. In some embodiments, the drain region 220 and the source region 222 of p-type FinFETs, for example, the pass-gate transistor PG-1, the pass-gate transistor PG-2, the pull-up transistor PU-1 and the pull-up transistor PU-2 are formed by implanting the portions of the semiconductor fin 204 that are not covered by the gate structure 215 and the spacers 218 with a p-type impurity such as boron, indium, or the like. In some embodiments, the drain region 220 and the source region 222 of n-type FinFETs, for example, the pull-down transistor PD-1 and the pull-down transistor PD-2 are formed by implanting the portions of the semiconductor fin 204 that are not covered by the gate structure 215 and the spacers 218 with an n-type impurity such as phosphorous, arsenic, antimony, or the like.

In some embodiments, the drain region 220 and the source region 222 are formed by etching portions of the semiconductor fin 204 that are not covered by the gate structure 215 and the spacers 218 to form recesses, and growing epitaxial regions in the recesses. The epitaxial regions may be formed of Si, Ge, SiP, SiC, SiPC, SiGe, SiAs, InAs, InGaAs, InSb, GaAs, GaSb, InAlP, InP, C, or a combination thereof. Accordingly, in FIG. 3, the drain region 220 and the source region 222 may by formed of silicon germanium (SiGe) in some exemplary embodiments, while the remaining semiconductor fin 204 may by formed of silicon. In some embodiments, p-type impurities is in-situ doped in the drain region 220 and the source region 222 during the epitaxy growing the drain region 220 and the source region 222 of the p-type FinFET 250, for example, the pass-gate transistor PG-1, the pass-gat transistor PG-2, the pull-up transistor PU-1 and the pull-up transistor PU-2. In addition, n-type impurities is in-situ doped in the drain region 220 and the source region 222 during the epitaxy growing the drain region 220 and the source region 222 of the n-type FinFET 250, for example, the pull-down transistor PD-1 and the pull-down transistor PD-2.

In some other embodiments, the pass-gate transistors PG-1 and PG-2, pull-up transistors PU-1 and PU-2, and pull-down transistors PD-1 and PD-2 of the SRAM cell 500 are planar MOS devices.

Figure 4:
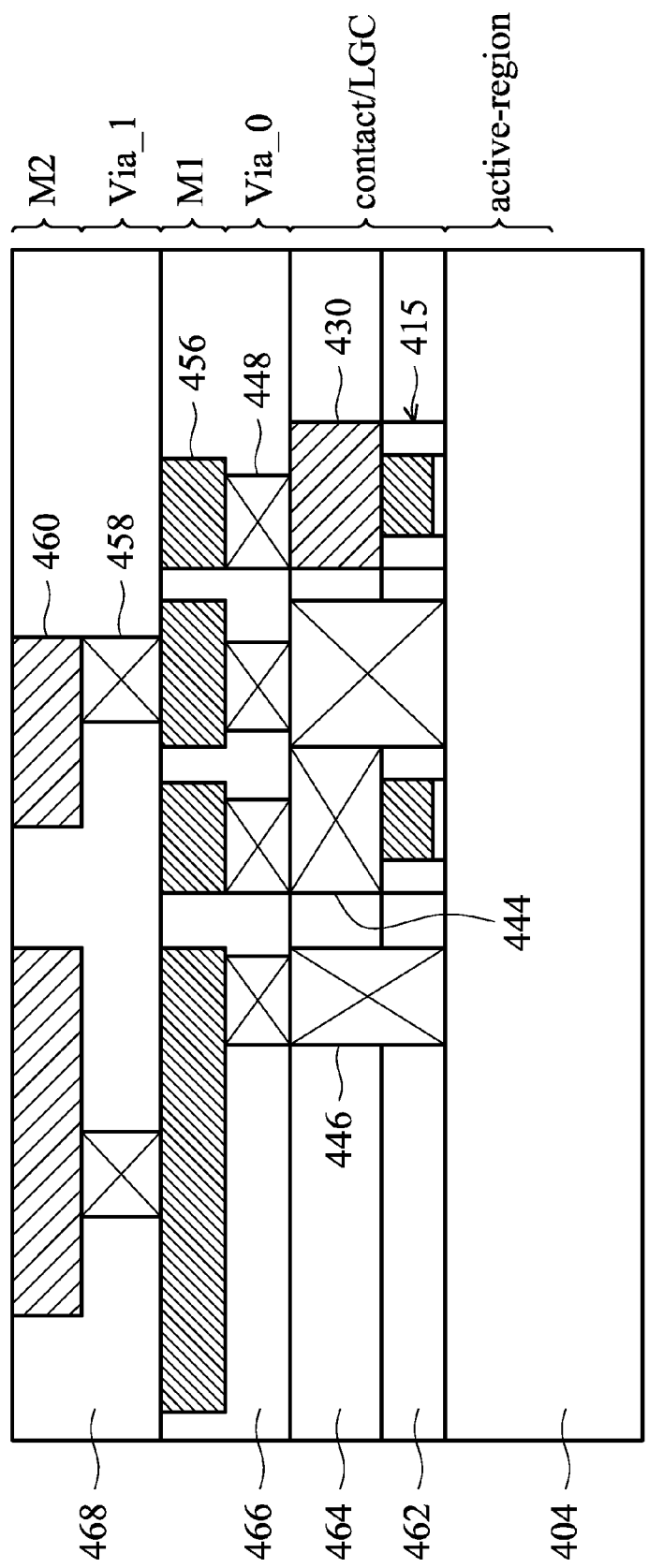
FIG. 4 illustrates a schematic cross-sectional view illustrating layers of an SRAM cell in accordance with some embodiments.

FIG. 4 illustrates a schematic cross-sectional view of a plurality of layers involved in the SRAM cell 500, which layers are formed on a semiconductor chip or a wafer. It should be noted that FIG. 4 is schematically illustrated to show various levels of an interconnect structure 400 and transistors, and may not reflect the actual cross-sectional view of SRAM cell 500. The interconnect structure 400 may include an active-region level (labeled as "active-region" in FIG. 4), a contact/LGC (local gate connection) level (labeled as "contact/LGC" in FIG. 4), via levels (labeled as "Via_0" and "Via_1" in FIG. 4), and metal-layer levels (labeled as "M1" and "M2" in FIG. 4) and 2. Each of the levels and layers includes one or more dielectric layers and the conductive features formed therein. The conductive features that are at the same level may have top surfaces substantially level to each other, bottom surfaces substantially level to each other, and may be formed simultaneously.

For example, the active-region level may include a semiconductor fin 404 (or a semiconductor substrate) formed therein. The contact/LGC (local gate connection) level may include transistors 415, contacts 446, gate contacts 444 and conductive line patterns 430 formed in dielectric layers 462 and 464. In addition, the dielectric layers 462 and 464 may serve as inter-layer dielectric (ILD) layers. The Via_0 level may include vias 448, and the M1 level may include conductive features 456 (e.g. metal lines). In addition, the vias 448 and the conductive features 456 are formed in a dielectric layer 466. The Via_1 level may include vias 458, and the M2 level may include conductive features 460 (e.g. metal lines). In addition, the vias 458 and the conductive features 460 are formed in a dielectric layer 468. The dielectric layers 466 and 468 may serve as inter-meal dielectric (IMD) layer. In some embodiments, the dielectric layers 462, 464, 466 and 468 are made of silicon oxide, un-doped silicate glass (USG), fluorinated silicate glass (FSG), carbon-doped silicate glass, silicon nitride or silicon oxynitride. In some embodiments, the dielectric layers 462, 464, 466 and 468 are made of an extreme low-k (ELK) dielectric material with a dielectric constant (k) less than about 2.5.

In some embodiments, the contact/LGC (local gate connection) level includes the contacts 446, the gate contacts 444 and the conductive line patterns 430 (e.g. the conductive line patterns 230-1, 230-2, 230-3 and 230-4 configured to connected separated gate electrode patterns of different FinFETs in FIGS. 5, 7, 9 and 11). The gate contacts 444 and the conductive line patterns 430 at the contact/LGC (local gate connection) level may be designed to connect the gate electrode patterns of transistors 415 to an overlying level such as the Via_0 level. In addition, the conductive line patterns 430 at the contact/LGC (local gate connection) level may be designed to connect the gate electrodes of different transistors. The contacts 446 at the contact/LGC (local gate connection) level connects the source regions and drain regions of transistors 415, pickup regions of well regions at the active-region level, and the like to an overlying level such as the Via_0 level.

Figure 5:
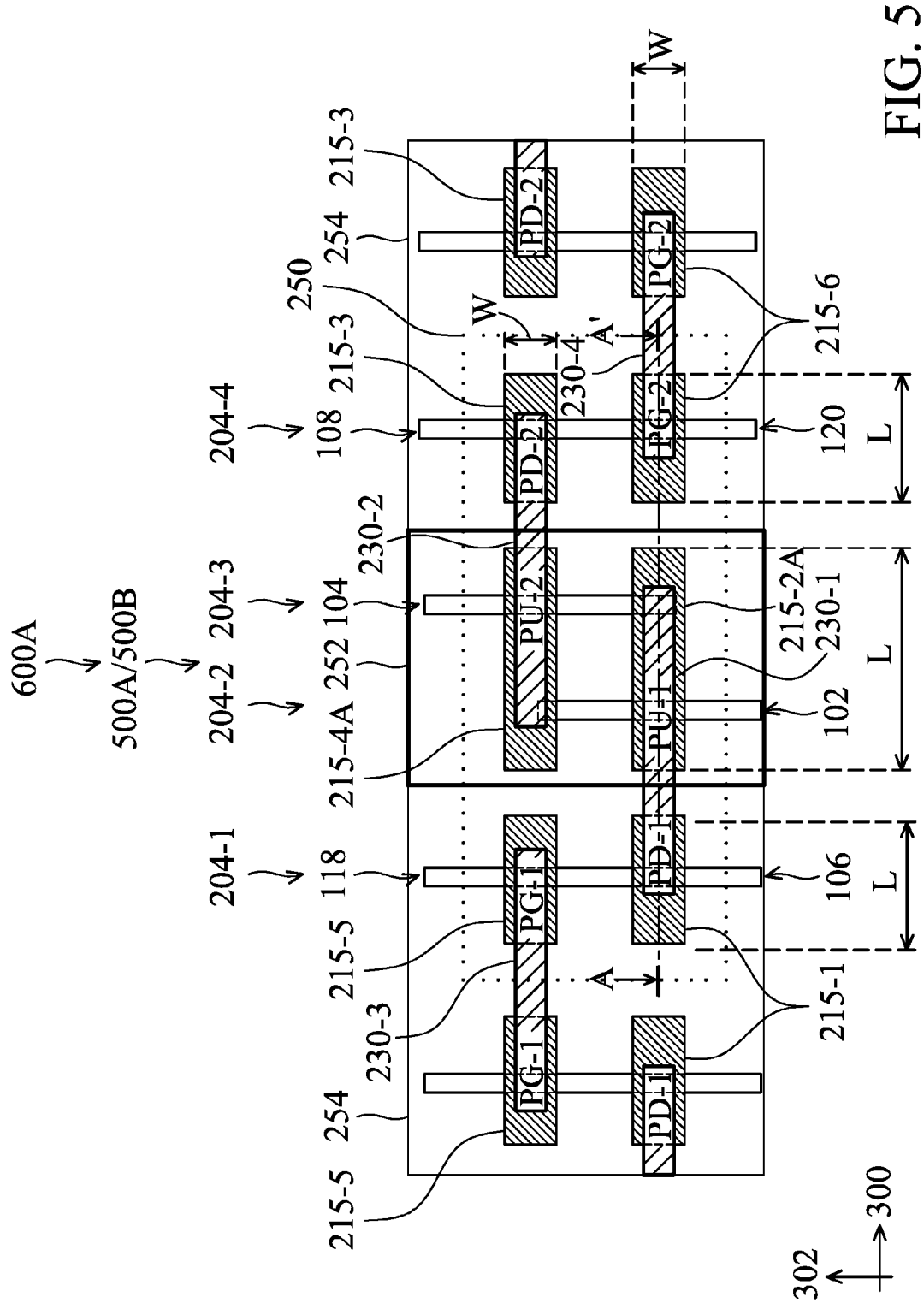
FIG. 5 illustrates a layout of SRAM cells of an SRAM cell structure in accordance with embodiments.
Figure 6A:
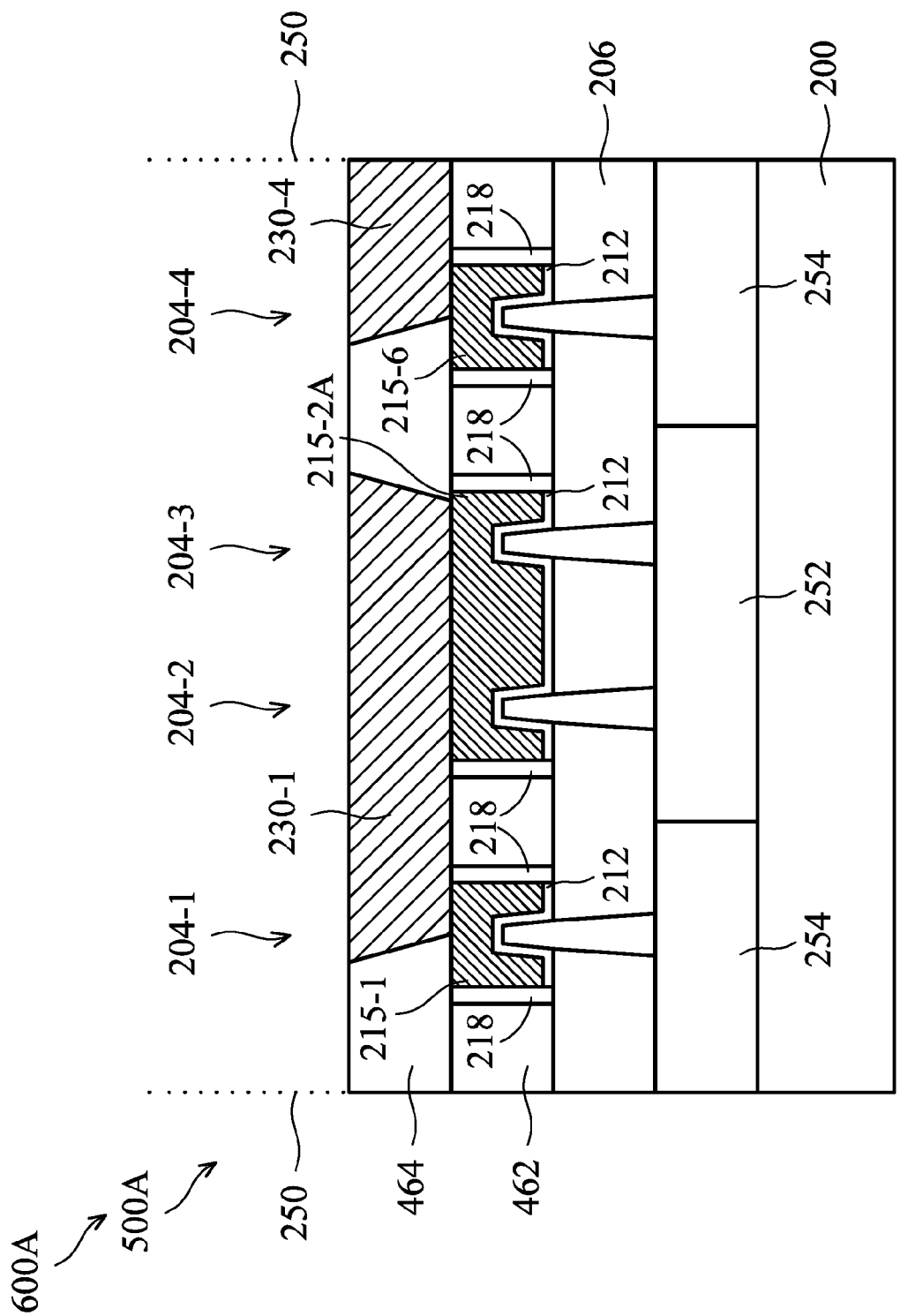
FIGS. 6A and 6B illustrate cross-sectional views taken along line A-A' of FIG. 5, showing cross-sectional views of an SRAM cell of the SRAM cell structure in accordance with embodiments.
Figure 6B:
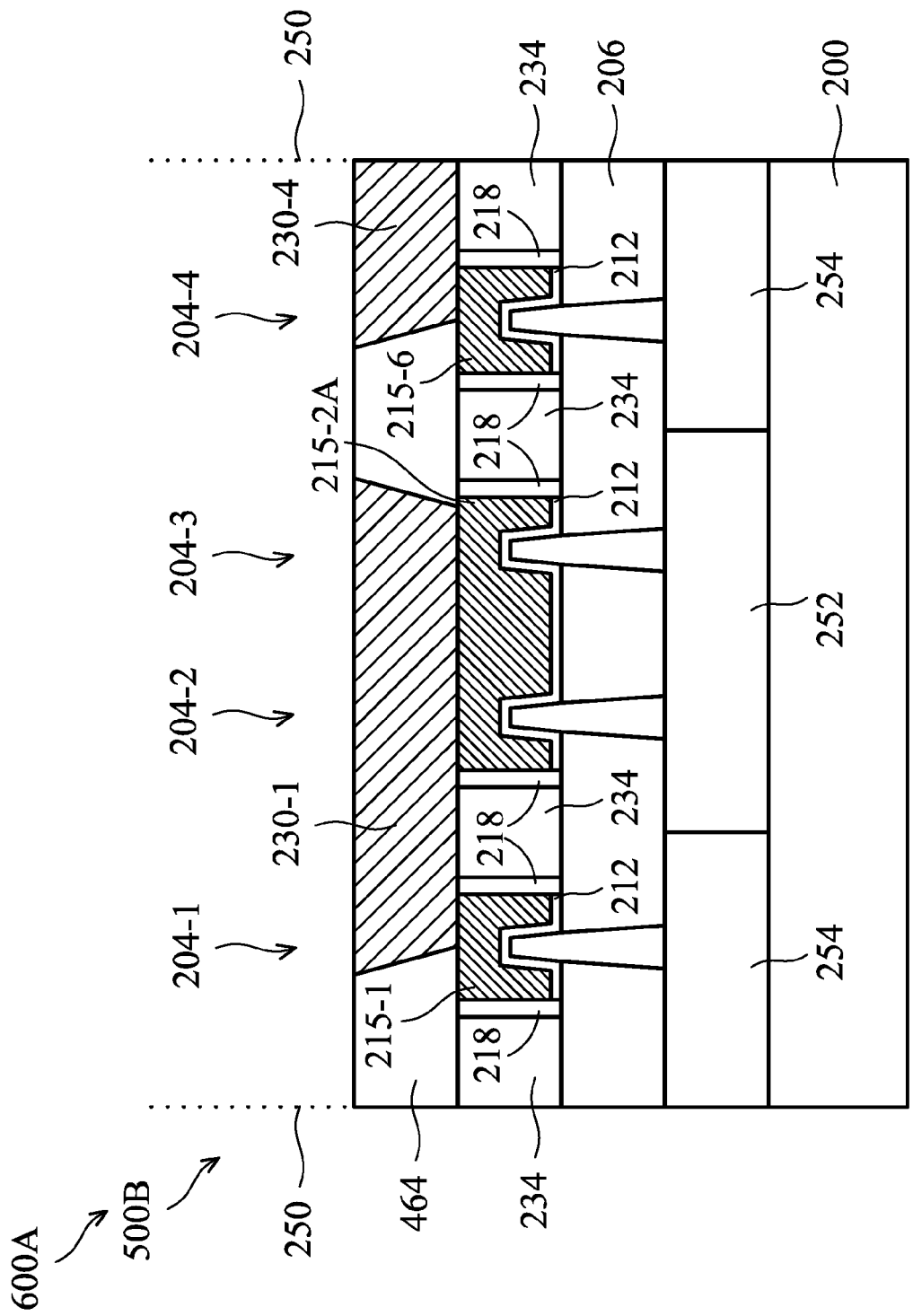

FIG. 5 illustrates a layout of SRAM cells (e.g. SRAM cells 500A or 500B) of an SRAM cell structure 600A in accordance with embodiments. FIG. 5 is also used to illustrate a plan view of the SRAM cell structure 600A, especially showing the relationship between the conductive line pattern (at the contact/LGC (local gate connection) level) and the gate electrode patterns of the FinFETs (including the pass-gate transistors PG-1 and PG-2, the pull-up transistors PU-1 and PU-2 and the pull-down transistors PD-1 and PD-2). It should be noted that some features, for example, the contacts in the active-region level, the gate contacts and the dielectric layer (e.g. the inter-layer dielectric (ILD) layer) at the contact/LGC (local gate connection) level are not shown for clarity. FIGS. 6A and 6B illustrates cross-sectional views taken along line A-A' of FIG. 5, showing cross-sectional views of the SRAM cell (e.g. the SRAM cell 500A and the SRAM cell 500B) of the SRAM cell structure 600A. FIGS. 6A and 6B are also used to illustrate the relationship between the conductive line pattern, the pull-down FinFET and the pull-up FinFET of the SRAM cell (e.g. the SRAM cell 500A and the SRAM cell 500B) in accordance with embodiments. In addition, FIGS. 6A and 6B illustrate the gate dielectric 212 underlying the gate electrode pattern, the spacers 218 on opposite sides of the gate electrode pattern and ILD layers 462 and 464.

As shown in FIG. 5, the SRAM cell structure 600A includes a plurality of SRAM cells (e.g. the SRAM cells 500A or 500B) arranged in an array including a plurality of rows and a plurality of columns. In some embodiments, the adjacent two SRAM cells are arranged in mirror symmetry. An outer boundary 250 of each of the SRAM cells is illustrated using dashed lines, which mark a rectangular region. An N_well region 252 may be arranged at the middle of the SRAM cell, and two P_well regions 254 may be arranged on opposite sides of the N_Well region 252. In addition, the CVdd-node 102, the CVdd-node 104, the CVss-node 106, the CVss-node 108, the BL node 118 and the BLB node 120, which are shown in FIG. 1, are also illustrated in FIG. 5.

In some embodiments, as shown in FIG. 5, each of the SRAM cells 500A (or 500B) includes the pass-gate fin field-effect transistors (FinFETs) PG-1 and PG-2, the pull-up FinFETs PU-1 and PU-2, and the pull-down FinFETs PD-1 and PD-2 formed by arranging six separated gate electrode patterns 215-1, 215-2A, 215-3, 215-4A, 215-5 and 215-6 on four semiconductor fins 204-1, 204-2, 204-3 and 204-4. Moreover, the SRAM cell 500A (or 500B) further includes four conductive line patterns 230-1, 230-2, 230-3, 230-4 arranged over the gate electrode patterns 215-1, 215-2A, 215-3, 215-4A, 215-5, 215-6, 216-1 and 216-2 and in the contact/LGC (local gate connection) level.

In some embodiments, as shown in FIG. 5, the semiconductor fins 204-1, 204-2, 204-3 and 204-4 are arranged along a direction 300 and extend along a direction 302 that is different from direction 300. For example, direction 302 is substantially perpendicular to direction 300. In some embodiments, direction 302 serves as the longitudinal direction of semiconductor fins 204-1, 204-2, 204-3 and 204-4.

In some embodiments, as shown in FIG. 5, the gate electrode patterns 215-1, 215-2A, 215-3, 215-4A, 215-5 and 215-6 are strip (line) shapes extending substantially along the direction 300. The gate electrode pattern 215-1 and the gate electrode pattern 215-5 are positioned overlying the semiconductor fin 204-1. The gate electrode pattern 215-2A is positioned overlying the semiconductor fin 204-2 and extends to cover an end portion of the semiconductor fin 204-3. The gate electrode pattern 215-3 and the gate electrode pattern 215-6 are positioned overlying the semiconductor fin 204-4. The gate electrode pattern 215-4A is positioned overlying the semiconductor fin 204-3 and extends to cover an end portion of the semiconductor fin 204-2.

In some embodiments, as shown in FIG. 5, the gate electrode pattern 215-1 forms the pull-down FinFET PD-1 with the underlying semiconductor fin 204-1 (in the P_well region 254 on the left side of the N_well region 252). The gate electrode pattern 215-2A forms the pull-up FinFET PU-1 with the underlying semiconductor fin 204-2 (in the N_well region 252). The gate electrode pattern 215-3 forms the pull-down FinFET PD-2 with the underlying semiconductor fin 204-4 (in the P_well region 254 on the right side of the N_well region 252). The gate electrode pattern 215-4A forms the pull-up FinFET PU-2 with the underlying semiconductor fin 204-3 (in the N_well region 252). The gate electrode pattern 215-5 forms the pass-gate FinFET PG-1 with the underlying semiconductor fin 204-1, which is the same semiconductor fin that also forms the pull-down FinFET PD-1. The gate electrode pattern 215-6 forms the pass-gate FinFET PG-2 with the underlying semiconductor fin 204-4, which is the same semiconductor fin that also forms the pull-down FinFET PD-2.

In some embodiments, the gate electrode pattern 215-2A of the pull-up FinFET PU-1 is positioned between the gate electrode pattern 215-1 of the pull-down FinFET PD-1 and the gate electrode pattern 215-6 of the pass-gate FinFET PG-2 substantially along the direction 300. In addition, the gate electrode pattern 215-4A of the pull-up FinFET PU-2 is positioned between the gate electrode pattern 215-3 of the pull-down FinFET PD-2 and the gate electrode pattern 215-5 of the pass-gate FinFET PG-1 substantially along the direction 300 (also shown in FIG. 6A).

In some embodiments, the gate electrode pattern 215-1 of the pull-down FinFET PD-1, the gate electrode pattern 215-2A of the pull-up FinFET PU-1, the gate electrode pattern 215-3 of the pull-down FinFET PD-2, the gate electrode pattern 215-4A of the pull-up FinFET PU-2, the gate electrode pattern 215-5 of the pass-gate FinFET PG-1 and the gate electrode pattern 215-6 of the pass-gate FinFET PG-2 are positioned within a boundary 250 of the SRAM cell 500A (or 500B). More specifically, the gate electrode pattern 215-5 of the pass-gate FinFET PG-1 and the gate electrode pattern 215-6 of the pass-gate FinFET PG-2 are positioned without extending into adjacent SRAM cell. In other word, the gate electrode patterns 215-5 of the pass-gate FinFETs PG-1 of the two adjacent SRAM cells are physically separated from each other. Similarly, the gate electrode patterns 215-6 of the pass-gate FinFETs PG-2 of the two adjacent SRAM cells are physically separated from each other.

In some embodiments, each of the gate electrode patterns 215-1, 215-2A, 215-3, 215-4A, 215-5 and 215-6 has a length L that substantially runs along direction 300 and a width W that substantially runs along direction 302. In some embodiments, the ratio of length L to width W is higher than or equal to 3.

In some embodiments, as shown in FIG. 5, the conductive line patterns 230-1, 230-2, 230-3 and 230-4 are strip (line) shapes extending substantially along the direction 302. The conductive line patterns 230-1, 230-2, 230-3 and 230-4 are arranged in the contact/LGC (local gate connection) level shown in FIG. 4. In some embodiments, the conductive line pattern 230-1 is positioned over and overlying the pull-down FinFET PD-1 and the pull-up FinFET PU-1 (also shown in FIG. 6A). In addition, the conductive line pattern 230-1 is electrically connected to and in contact with the gate electrode pattern 215-1 of the pull-down FinFET PD-1 and the gate electrode pattern 215-2A of the pull-up FinFET PU-1. Therefore, the pull-down FinFET PD-1, the pull-up FinFET PU-1 and the conductive line pattern 230-1, which is configured to connect the individual gate electrode patterns of the pull-down FinFET PD-1 and the pull-up FinFET PU-1, may collectively form a first complementary metal-oxide-semiconductor (CMOS) inverter (e.g. the first inverter Inverter-1 shown in FIG. 2) of the SRAM cell. In the first inverter of the SRAM cell, the gate electrode pattern 215-1 of the pull-down FinFET PD-1 is physically separated from the gate electrode pattern 215-2A of the pull-up FinFET PU-1.

In some embodiments, as shown in FIG. 5, the conductive line pattern 230-2 is positioned over and overlying the pull-down FinFET PD-2 and the pull-up FinFET PU-2. In addition, the conductive line pattern 230-2 is electrically connected to and in contact with the gate electrode pattern 215-3 of the pull-down FinFET PD-2 and the gate electrode pattern 215-4A of the pull-up FinFET PU-2. Therefore, the pull-down FinFET PD-2, the pull-up FinFET PU-2 and the conductive line pattern 230-2, which is configured to connect the individual gate electrode patterns of the pull-down FinFET PD-2 and the pull-up FinFET PU-2, may collectively form a second complementary metal-oxide-semiconductor (CMOS) inverter (e.g. the second inverter Inverter-2 shown in FIG. 2) of the SRAM cell 500A (or 500B). In the second inverter of the SRAM cell, the gate electrode pattern 215-3 of the pull-down FinFET PD-2 is physically separated from the gate electrode pattern 215-4A of the pull-up FinFET PU-2 in the second inverter of the SRAM cell 500A (or 500B).

In some embodiments, as shown in FIG. 5, the conductive line pattern 230-3 is positioned over and overlying the pass-gate FinFET PG-1. The conductive line pattern 230-3 is electrically connected to and in contact with the gate electrode pattern 215-5 of the pass-gate FinFET PG-1. In addition, the conductive line pattern 230-3 extends outside the boundary 250 of the SRAM cell to connect the gate electrode pattern 215-5 of the pass-gate FinFET PG-1 of the adjacent SRAM cell. In some embodiments, the conductive line pattern 230-4 is positioned over and overlying the pass-gate FinFET PG-2. The conductive line pattern 230-4 is electrically connected to and in contact with the gate electrode pattern 215-6 of the pass-gate FinFET PG-2. In addition, the conductive line pattern 230-4 extends outside the boundary 250 of the SRAM cell to connect the gate electrode pattern 215-6 of the pass-gate FinFET PG-2 of the adjacent SRAM cell.

In some embodiments, as shown in FIG. 6B, the SRAM cell 500B further includes a dielectric layer 234 between any two adjacent gate electrode patterns. For example, the dielectric layer 234 is positioned between the gate electrode pattern 215-1 of the pull-down FinFET PD-1 and the gate electrode pattern 215-2A of the pull-up FinFET PU-1. Similarly, the dielectric layer 234 may be positioned between the gate electrode pattern 215-3 of the pull-down FinFET PD-2 and the gate electrode pattern 215-4A of the pull-up FinFET PU-2. In addition, the dielectric layer 234 may be formed filling spaces between the gate electrode patterns 215-1, 215-2A, 215-3, 215-4A, 215-5 and 215-6 of the pass-gate FinFETs PG-1 and PG-2, the pull-up FinFETs PU-1 and PU-2, and the pull-down FinFETs PD-1 and PD-2. The dielectric layer 234 may be coplanar with top surfaces of the gate electrode patterns 215-1, 215-2A, 215-3, 215-4A, 215-5 and 215-6. The dielectric layer 234 may be formed in the contact/LGC (local gate connection) level shown in FIG. 4 and covered by the dielectric (ILD) layer 464 and the conductive line patterns 230-1, 230-2, 230-3 and 230-4. The dielectric layer 234 may help to improve the breakdown voltage of the pass-gate FinFETs PG-1 and PG-2, the pull-up FinFETs PU-1 and PU-2, and the pull-down FinFETs PD-1 and PD-2 of the SRAM cell 500B.

In some embodiments, the dielectric layer 234 includes a single layer or a multi-layer structure. In addition, the dielectric layer 234 may be formed of a high dielectric constant (high-k) dielectric material whose dielectric constant is higher than that of silicon dioxide (or higher than the ILD layers 462 and 464). In some embodiments, the dielectric constant of the dielectric layer 234 is greater than 5. For example, the dielectric layer 234 is formed of nitride-based dielectric materials, metal-oxide dielectric materials or a combination thereof. For example, the dielectric layer 234 includes hafnium oxide, zirconium oxide, aluminum oxide, silicon nitride, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the dielectric layer 234 and the gate dielectric 212 include the same material.

Figure 7:
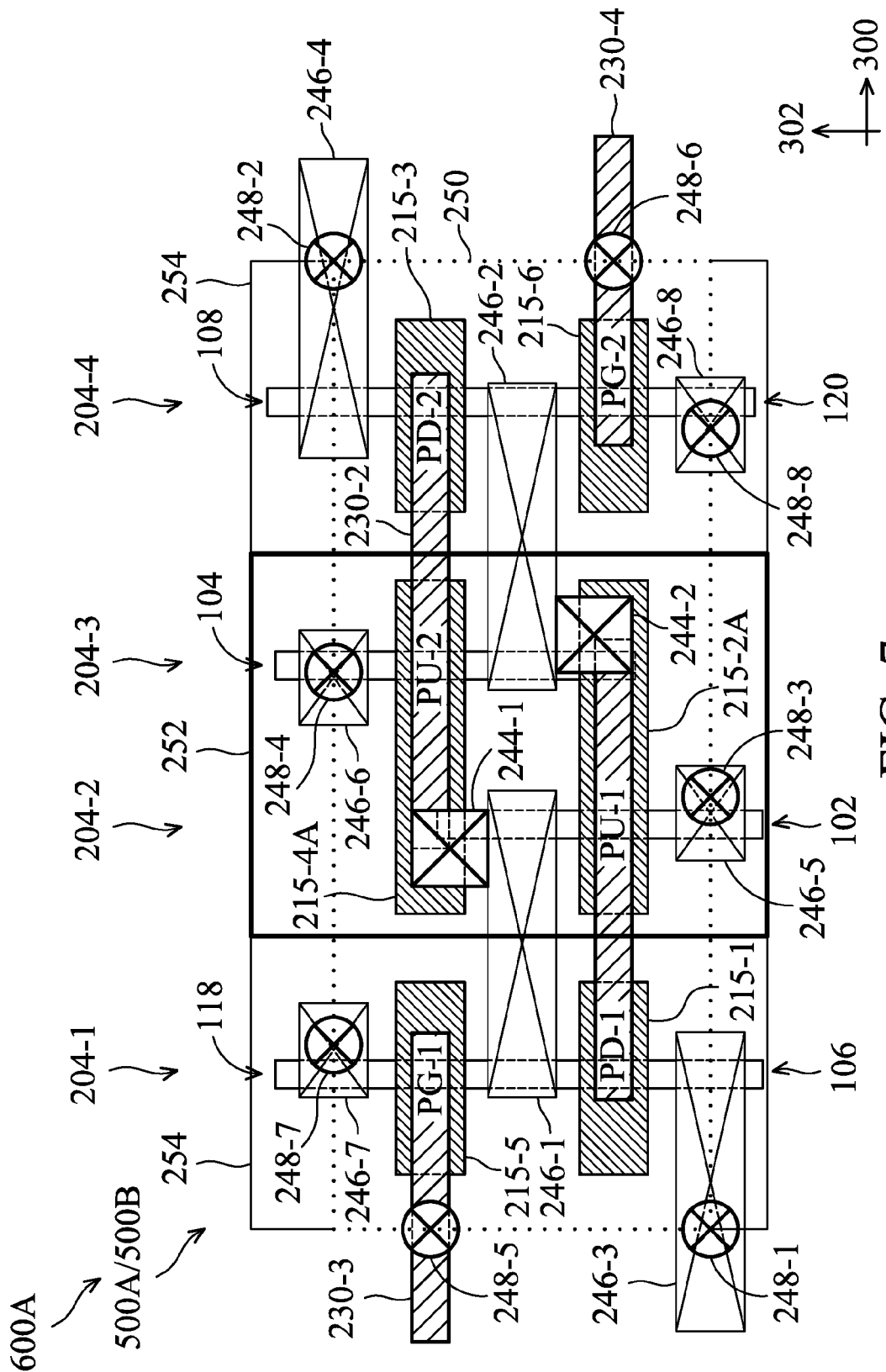
FIG. 7 illustrates a layout of an SRAM cell of an SRAM cell structure in accordance with embodiments.

FIG. 7 illustrates a layout of the SRAM cell (e.g. the SRAM cell 500A or 500B) of the SRAM cell structure 600A in accordance with embodiments. FIG. 7 is also used to illustrate a plan view of an interconnect structure used as the routings of the SRAM cell of the SRAM cell structure 600A. FIG. 7 shows the contacts at the active-region level and the contact/LGC (local gate connection) level and the vias at the Via_0 level overlying the contact/LGC (local gate connection) level. It should be noted that various levels of the interconnect structure shown in FIG. 7 is merely an example and is not intended to be limiting the actual cross-sectional view of SRAM cell.

As shown in FIG. 7, a butted contact plug (Butt-CO) 244-1 is configured to electrically connect the conductive line pattern 230-2 to the drain region of the pull-up FinFET PU-1. In other words, the Butt-CO 244-1 is configured to electrically connect the gate electrode pattern 215-3 of the pull-down FinFET PD-2 and the gate electrode pattern 215-4A of the pull-up FinFET PU-2 to the drain region of the pull-up FinFET PU-1. In addition, a butted contact plug (Butt-CO) 244-2 is configured to electrically connect the conductive line pattern 230-1 to the drain region of the pull-up FinFET PU-2. In other words, the Butt-CO 244-2 is configured to electrically connect the gate electrode pattern 215-1 of the pull-down FinFET PD-1 and the gate electrode pattern 215-2B of the pull-up FinFET PU-1 to the drain region of the pull-up FinFET PU-2. In some embodiments, the Butt-CO 244-1 and the Butt-CO 244-2 are formed at the contact/LGC (local gate connection) level shown in FIG. 4. In some embodiments, the Butt-CO 244-1 and the Butt-CO 244-2 have a longitudinal direction substantially along the longitudinal direction of semiconductor fins 204-1, 204-2, 204-3 and 204-4, which is substantially along the direction 302.

As shown in FIG. 7, a long contact 246-1 is configured to electrically connect the semiconductor fin 204-1 (the drain region of the pull-down FinFET PD-1) to the semiconductor fin 204-2 and the Butt-CO 244-1. Therefore, the long contact 246-1 and the Butt-CO 244-1 form the storage node 112 (also refer to FIG. 1). In addition, a long contact 246-2 is configured to electrically connect the semiconductor fin 204-4 (the drain region of the pull-down FinFET PD-2) to the semiconductor fin 204-3 and the Butt-CO 244-2. Therefore, the long contact 246-2 and the Butt-CO 244-2 form the storage node 110 (also refer to FIG. 1). In some embodiments, the long contacts 246-1 and 246-2 are formed at the contact/LGC (local gate connection) level shown in FIG. 4. In some embodiments, the long contacts 246-1 and 246-2 have a longitudinal direction along the direction 300 and perpendicular to the longitudinal direction of semiconductor fins 204-1, 204-2, 204-3 and 204-4, which is substantially along the direction 302. In the manufacturing of the SRAM cell on physical semiconductor wafers, the Butt-CO 244-1 and the long contact 246-1 may be formed as a single continuous butted contact plug. Similarly, the Butt-CO 244-2 and the long contact 246-2 may be formed as a single continuous butted contact plug.

As shown in FIG. 7, a long contact 246-3 is configured to electrically connect the semiconductor fin 204-1 (the source region of the pull-down FinFET PD-1) to a via 248-1 at the Via_0 level. Therefore, the long contact 246-3 and the via 248-1 form the CVss-nodes 106 (also refer to FIG. 1). In addition, a long contact 246-4 is configured to electrically connect the semiconductor fin 204-4 (the source region of the pull-down FinFET PD-2) to a via 248-2 at the Via_0 level. Therefore, the long contact 246-4 and the via 248-2 form the CVss-nodes 108 (also refer to FIG. 1).

As shown in FIG. 7, a long contact 246-5 is configured to electrically connect the semiconductor fin 204-2 (the source region of the pull-up FinFET PU-1) to a via 248-3 in the Via_0 level. Therefore, the long contact 246-5 and the via 248-3 form the CVdd-node 102 (also refer to FIG. 1). In addition, a long contact 246-6 is configured to electrically connect the semiconductor fin 204-3 (the source region of the pull-up FinFET PU-2) to a via 248-4 in the Via_0 level. Therefore, the long contact 246-6 and the via 248-4 form the CVdd-node 104 (also refer to FIG. 1).

As shown in FIG. 7, a via 248-5 is configured to electrically connect the underlying conductive line pattern 230-3. In other words, the via 248-5 may serve as a word line via, which electrically connect the gate electrode pattern 215-5 of the pass-gate FinFET PG-1. In addition, a via 248-6 is configured to electrically connect the underlying conductive line pattern 230-4. In other words, the via 248-6 may serve as a word line via, which electrically connect the gate electrode pattern 215-6 of the pass-gate FinFET PG-2.

As shown in FIG. 7, a long contact 246-7 is configured to electrically connect the semiconductor fin 204-1 (the source region of the pass-gate FinFET PG-1) to a via 248-7 at the Via_0 level. Therefore, the long contact 246-7 and the via 248-7 form the bit-line node 118 (also refer to FIG. 1). In addition, a long contact 246-8 is configured to electrically connect the semiconductor fin 204-4 (the source region of the pass-gate FinFET PG-2) to a via 248-8 at the Va_0 level. Therefore, the long contact 246-8 and the via 248-8 form the bit-line bar node 120 (also refer to FIG. 1).

Figure 8:
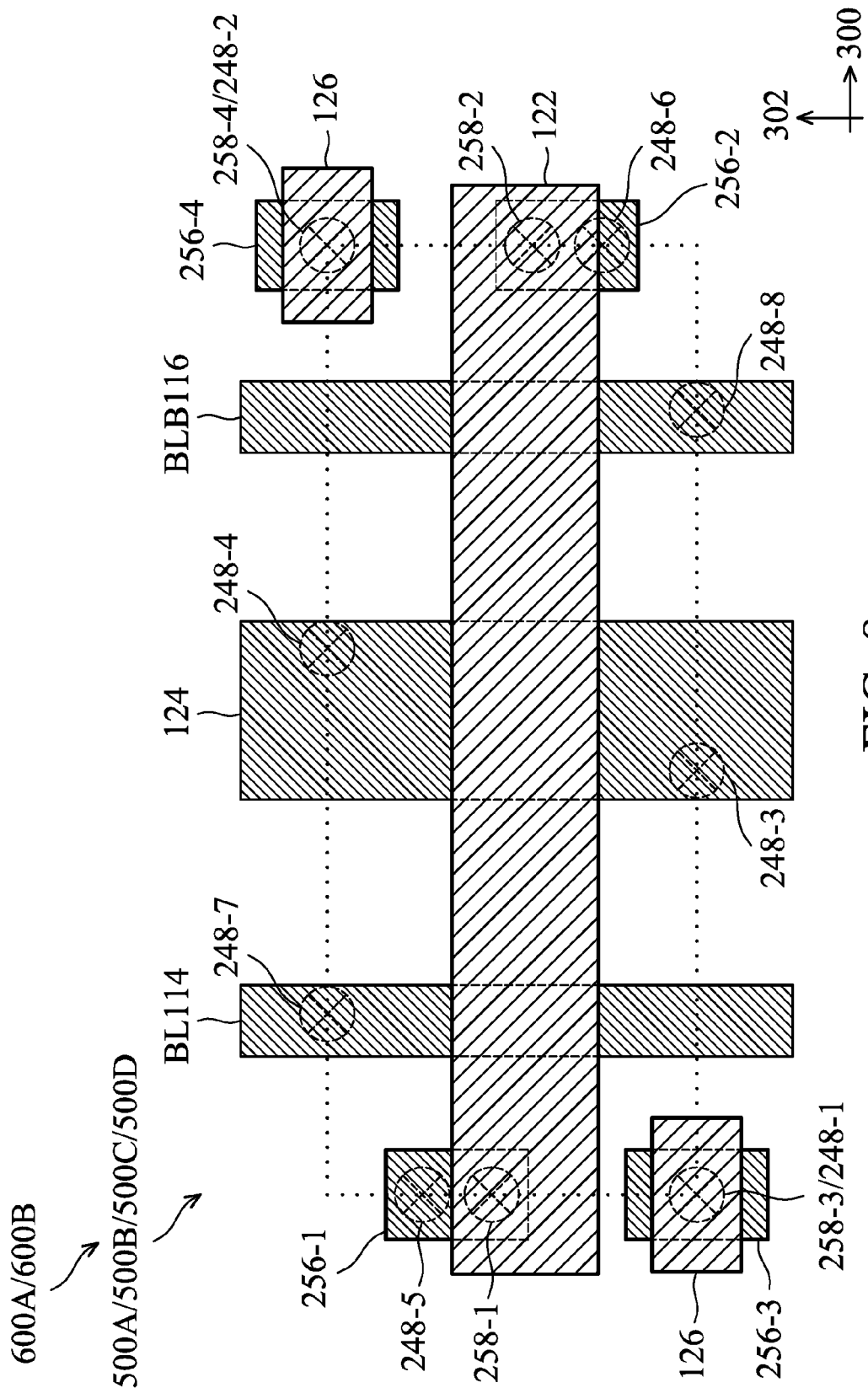
FIG. 8 illustrates a layout of an SRAM cell of an SRAM cell structure in accordance with embodiments.

FIG. 8 illustrates a layout of back-end features of the SRAM cell 500A (or 500B) of the SRAM cell structure 600A in accordance with embodiments. The back-end features include the vias at the Via_0 level and the Via_1 level, and metal lines in the M1 level and the M2 level.

As shown in FIGS. 7 and 8, the bit-line (BL) 114, the bit-line bar (BLB) 116 and the CVdd line 124 are arranged at the M1 level and substantially extend along the direction 302. The bit-line (BL) 114 may be electrically connected to the underlying via 248-7, and together they form the bit-line node 118 (also refer to FIG. 1). In addition, the bit-line (BL) 114 may be electrically connected to the source region of the pass-gate FinFET PG-1. The bit-line Bar (BLB) 116 may be electrically connected to the via 248-8, and together they form the bit-line bar node 120 (also refer to FIG. 1). In addition, the bit-line Bar (BLB) 116 may be electrically connected to the source region of the pass-gate FinFET PG-2. The CVdd line 124 may be electrically connected to the via 248-3, and together they form the CVdd-node 102 (also refer to FIG. 1). In addition, the CVdd line 124 may be electrically connected to the via 248-4, and together they form the CVdd-node 104 (also refer to FIG. 1). Therefore, the CVdd line 124 may be electrically connected to the source regions of the pull-up FinFET PU-1 and the pull-up FinFET PU-2.

As shown in FIG. 8, the word-line (WL) 122 and the CVss lines 126 are arranged at the M2 level and extend along the direction 300. The WL 122 may be electrically connected to the underlying via 248-5 (the word line via) at the Via_0 level through a metal line 256-1 at the M1 level and a Via 258-1 at the Via_1 level. In addition, the WL 122 may be electrically connected to the underlying via 248-6 (the word line via) at the Via_0 level through a metal line 256-2 at the M1 level and a via 258-2 at the Via_1 level. The CVss line 126 may be electrically connected to the underlying via 248-1 (the CVss-nodes 106 shown in FIG. 1) at the Via_0 level through a metal line 256-3 at the M1 level and a via 258-3 at the Via_1 level. In addition, the CVss line 126 be electrically connected to the underlying via 248-2 (the CVss-nodes 108 shown in FIG. 1) at the Via_0 level through a metal line 256-4 at the M1 level and a via 258-4 at the Via_1 level. Therefore, the WL 122 may be electrically connected to the conductive line pattern 230-3 and the conductive line pattern 230-4.

In some embodiments, the SRAM cell structure 600A includes a plurality of SRAM cells (e.g. the SRAM cells 500A or 500B) arranged in an array. The gate electrode patterns of the SRAM cell of the SRAM cell structure on different semiconductor fins are physically separated from each other. For example, the gate electrode pattern 215-1 of the pull-down FinFET PD-1 and the gate electrode pattern 215-2A of the pull-up FinFET PU-1 are arranged in such a way that they are physically separated from each other and located on different semiconductor fins. In addition, the gate electrode pattern 215-3 of the pull-down FinFET PD-2 and the gate electrode pattern 215-4A of the pull-up FinFET PU-2 are arranged in such a way that they are physically separated from each other and located on different semiconductor fins. Furthermore, the ends of the gate electrode patterns on the same semiconductor fin may be aligned with each other substantially along the longitudinal direction of semiconductor fin (e.g. the direction 302). Moreover, the gate electrode patterns may have the same or similar dimensions. For example, the ends of the gate electrode patterns 215-1 and 215-5 on the same semiconductor fin 204-1 are aligned with each other and have the same or similar dimensions. The ends of the gate electrode patterns 215-2A and 215-4A on the same semiconductor fins 204-2 and 204-3 are aligned with each other and have the same or similar dimensions. The ends of the gate electrode patterns 215-3 and 215-6 on the same semiconductor fin 204-1 are aligned with each other and have the same or similar dimensions. Therefore, the gate electrode patterns of the SRAM cell of the SRAM cell structure shows a regular pattern arrangement.

In some embodiments, the gate electrode pattern 215-1 of the pull-down FinFET PD-1 and the gate electrode pattern 215-2A of the pull-up FinFET PU-1 separated from each other are connected to the overlying conductive line pattern 230-1 (at the contact/LGC level). The gate electrode pattern 215-3 of the pull-down FinFET PD-2 and the gate electrode pattern 215-4A of the pull-up FinFET PU-2 separated from each other may be connected to the overlying conductive line pattern 230-2 (at the contact/LGC level). The conductive line patterns 230-3 may be electrically connected to the underlying gate electrode pattern 215-5 of the pass-gate FinFET PG-1 and may extend outside the boundary 250 of the SRAM cells along the direction 300. In addition, the conductive line pattern 230-4 may be electrically connected to the underlying gate electrode pattern 215-6 of the pass-gate FinFET PG-2 and may extend outside the boundary 250 of the SRAM cells along the direction 300. Due to the additional conductive line patterns, the SRAM cell may have a regular pattern arrangement in the gate electrode patterns of the FinFETs (e.g. the pass-gate FinFETs PG-1 and PG-2, the pull-up FinFETs PU-1 and PU-2 and the pull-down FinFETs PD-1 and PD-2), so that the performance (e.g. the short channel leakage, turn-on current (Ion) degradation and the reliability of gate to contact bridge) of the SRAM cells of the SRAM cell structure 600A can be improved.

Figure 9:
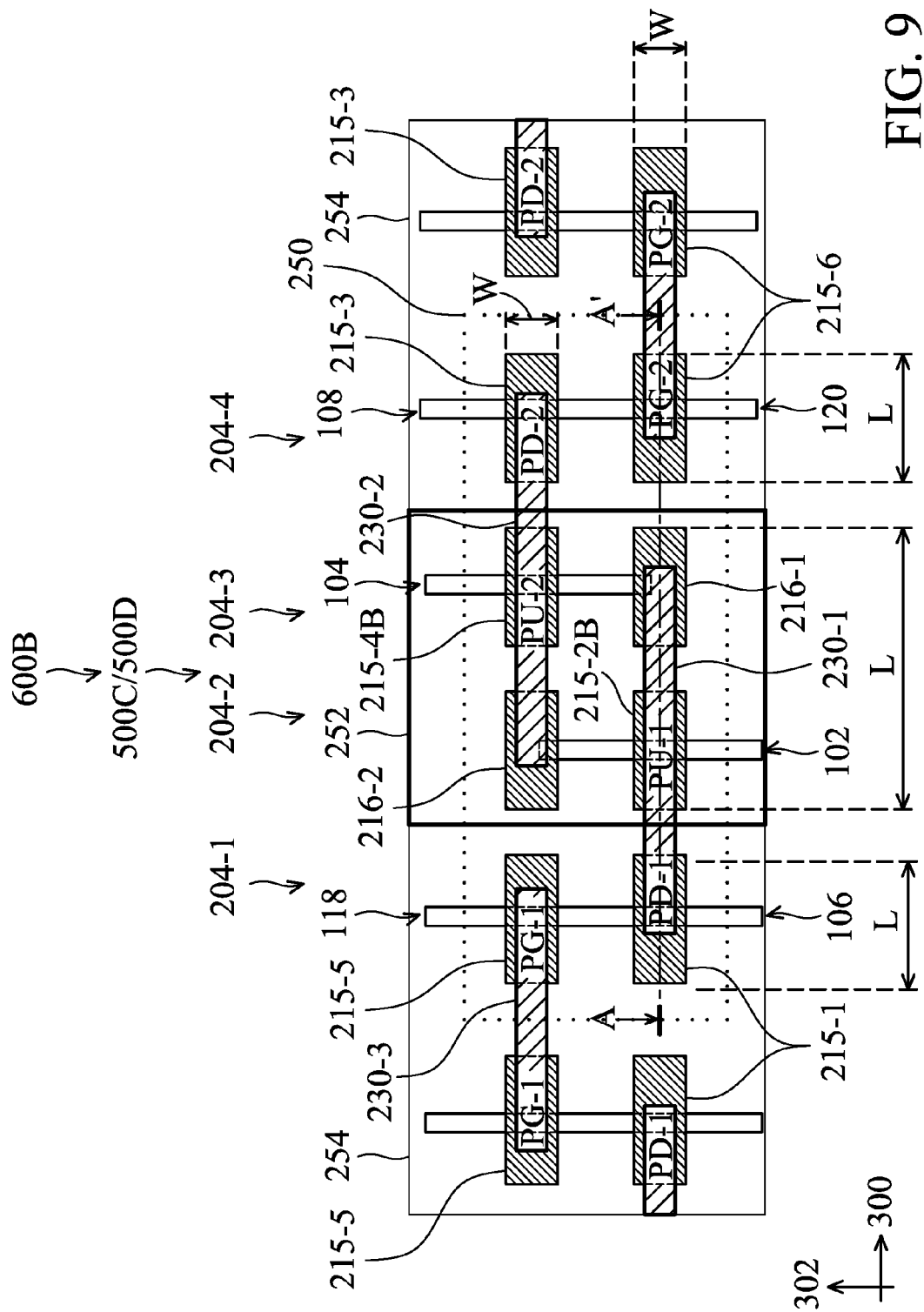
FIG. 9 illustrates a layout of SRAM cells of an SRAM cell structure in accordance with embodiments.
Figure 10A:
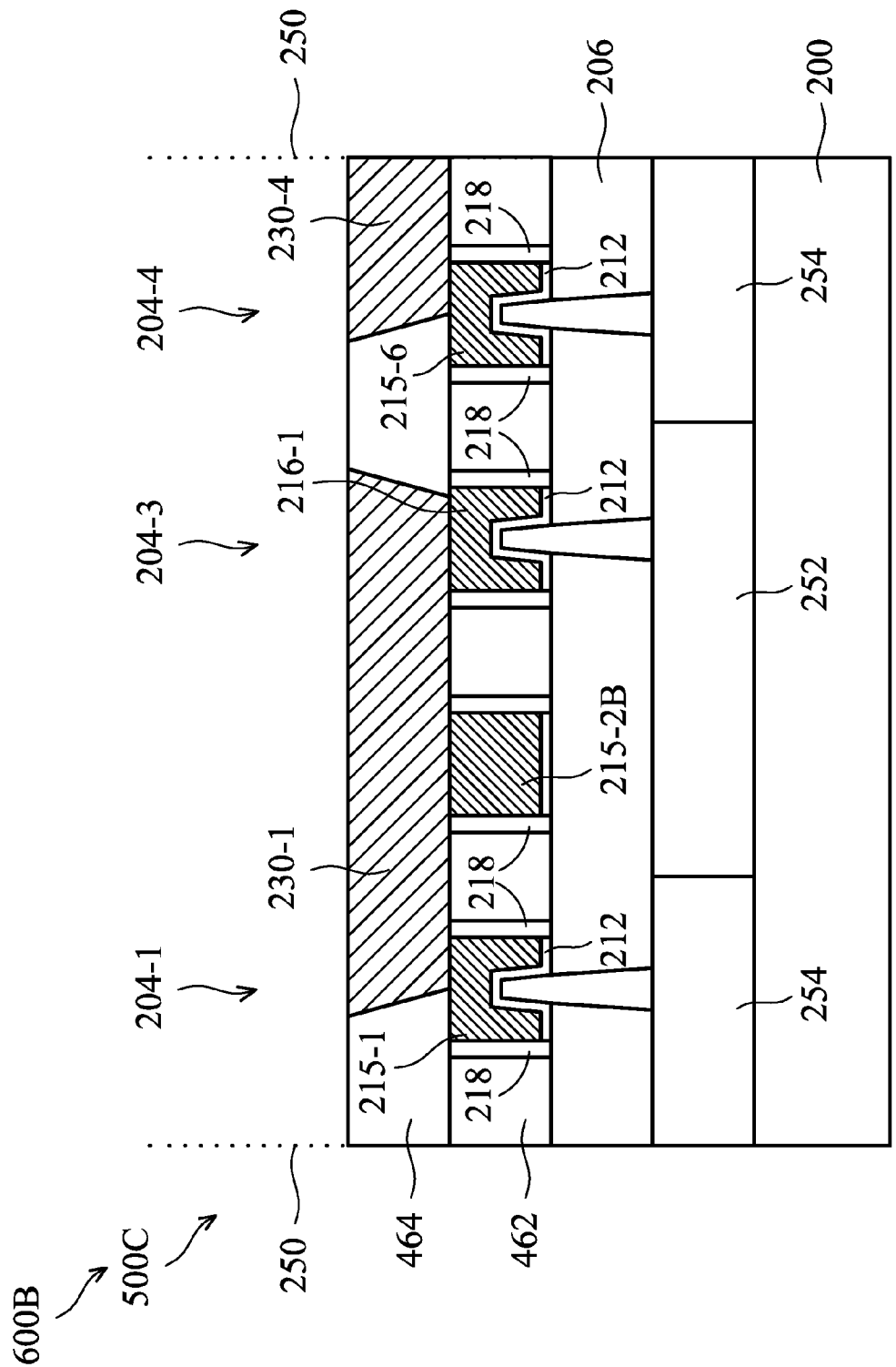
FIGS. 10A and 10B illustrate cross-sectional views taken along line A-A' of FIG. 9.
Figure 10B:
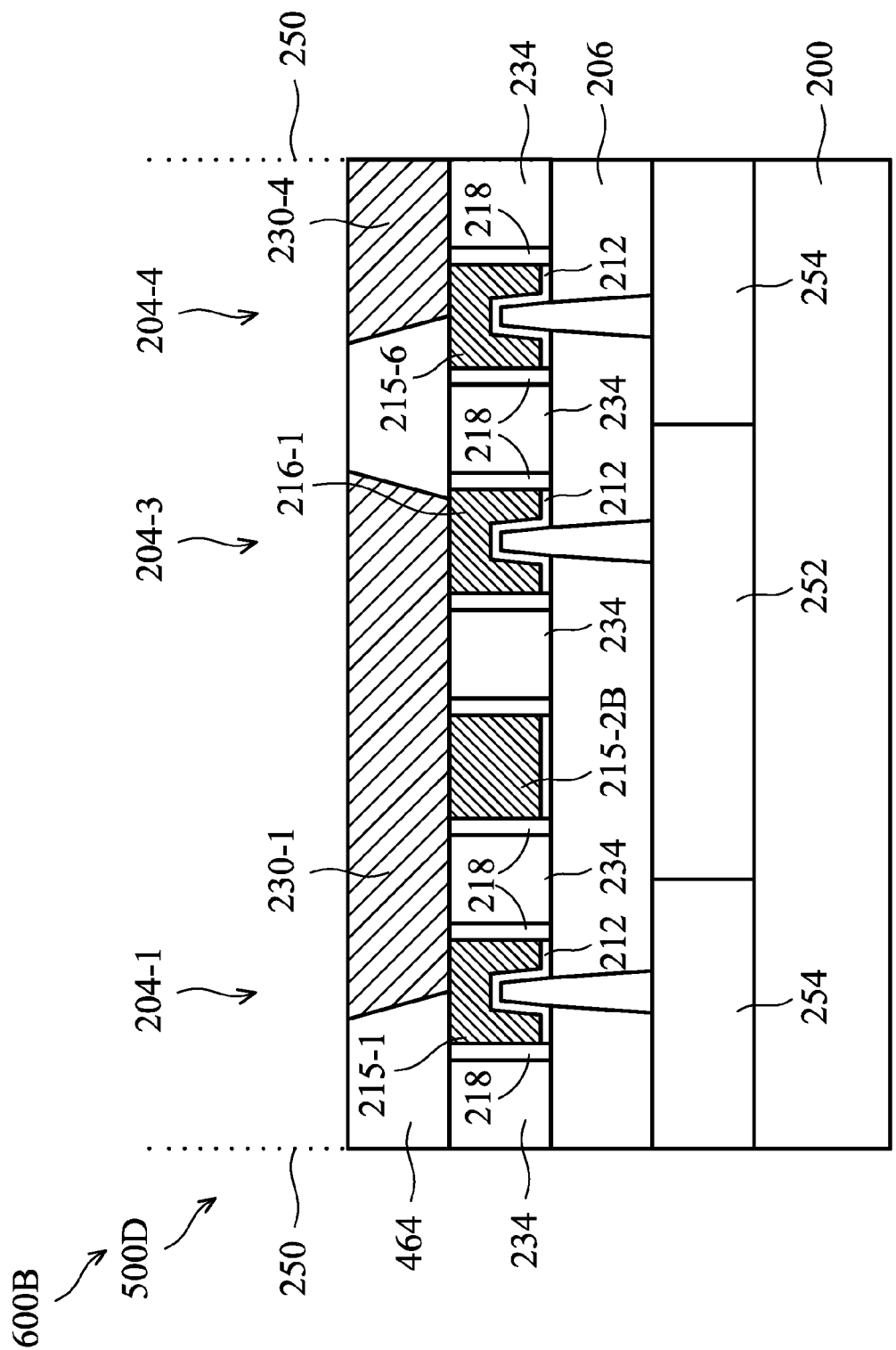

FIG. 9 illustrates a layout of SRAM cells (e.g. SRAM cells 500C or 500D) of an SRAM cell structure 600B in accordance with embodiments. FIG. 9 is also used to illustrate a plan view of the SRAM cell structure 600B, especially showing the relationship between the conductive line pattern (at the contact/LGC (local gate connection) level) and the gate electrode patterns of the FinFETs (including the pass-gate transistors PG-1 and PG-2, the pull-up transistors PU-1 and PU-2 and the pull-down transistors PD-1 and PD-2) and two additional dummy gate electrode patterns. It should be noted that some features, for example, the contacts at the active-region level, the gate contacts and the dielectric layer (e.g. the inter-layer dielectric (ILD) layer) at the contact/LGC (local gate connection) level are not shown for clarity. FIGS. 10A and 10B illustrates cross-sectional views taken along line A-A' of FIG. 9, showing cross-sectional views of the SRAM cell (e.g. the SRAM cell 500C and the SRAM cell 500D) of the SRAM cell structure 600B. FIGS. 10A and 10B are also used to illustrate the relationship between the conductive line pattern, the pull-down FinFET and the pull-up FinFET of the SRAM cell in accordance with embodiments. In addition, FIG. 10A illustrates the gate dielectric 212 underlying the gate electrode pattern and the spacers 218 on opposite sides of the gate electrode pattern. Elements of the embodiments hereinafter, that are the same or similar to those previously described with reference to FIGS. 5, 6A and 6B, are not repeated for brevity.

As shown in FIG. 9, the SRAM cell structure 600B includes a plurality of SRAM cells (e.g. the SRAM cells 500C or 500D) arranged in an array including a plurality of rows and a plurality of columns. In some embodiments, the adjacent two SRAM cells are arranged in mirror symmetry. An outer boundary 250 of each of the SRAM cells is illustrated using dashed lines, which mark a rectangular region. An N_well region 252 may be arranged at the middle of the SRAM cell, and two P_well regions 254 may be arranged on opposite sides of the N_Well region 252. In addition, the CVdd-node 102, the CVdd-node 104, the CVss-node 106, the CVss-node 108, the BL node 118, and the BLB node 120, which are shown in FIG. 1, are also illustrated in FIG. 9.

In some embodiments, as shown in FIG. 9, each of the SRAM cells includes pass-gate fin field-effect transistors (FinFETs) PG-1 and PG-2, pull-up FinFETs PU-1 and PU-2, and pull-down FinFETs PD-1 and PD-2 formed by six separated gate electrode patterns 215-1, 215-2B, 215-3, 215-4B, 215-5 and 215-6 arranged on four semiconductor fins 204-1, 204-2, 204-3 and 204-4. In addition, two dummy gate electrode patterns 216-1 and 216-2 are respectively arranged on the semiconductor fins 204-3 and 204-2. Moreover, the SRAM cell further includes conductive line patterns 230-1, 230-2, 230-3, 230-4 arranged over the gate electrode patterns 215-1, 215-2B, 215-3, 215-4B, 215-5, 215-6, 216-1 and 216-2 and in the contact/LGC (local gate connection) level.

In the SRAM cell (e.g. the SRAM cells 500C or 500D), the pull-up FinFET PU-1 and the pull-down FinFET PD-1 form a first inverter (e.g. the first inverter Inverter-1 shown in FIG. 1) of the SRAM cell. In addition, the pull-up FinFET PU-2 and the pull-down FinFET PD-2 form a second inverter (e.g. the second inverter Inverter-2 shown in FIG. 1) of the SRAM cell. In some embodiments, the structure, component, configuration and arrangement of the pull-down FinFETs PD-1 and PD-2 and the pass-gate FinFETs PG-1 and PG-2 of the SRAM cell 500C (or 500D) may be similar to, or the same as the pull-down FinFETs PD-1 and PD-2 and the pass-gate FinFETs PG-1 and PG-2 of the SRAM cell 500A (or 500B) shown in FIG. 5 and are not repeated herein.

In some embodiments, as shown in FIG. 9, the gate electrode patterns 215-1, 215-2B, 215-3, 215-4B, 215-5, 215-6, 216-1 and 216-2 of the SRAM cell 500C (or 500D) are strip (line) shapes extending substantially along the direction 302. The gate electrode pattern 215-2B is positioned overlying the semiconductor fin 204-2. It should be noted that the gate electrode pattern 215-2B is formed without extending to cover the semiconductor fin 204-3. The gate electrode pattern 215-4B is positioned overlying the semiconductor fin 204-3. It should be noted that the gate electrode pattern 215-4B is formed without extending to cover the semiconductor fin 204-2.

In some embodiments, the gate electrode pattern 216-1 is positioned overlying the semiconductor fin 204-3. The gate electrode pattern 216-1 may cover an end portion of the semiconductor fin 204-3, which is close to the drain of the pull-up FinFET PU-2, and the isolating feature 206 adjacent to the end portion of the semiconductor fin 204-3. In addition, the gate electrode pattern 216-1 may be aligned with the gate electrode pattern 215-4B of the pull-up FinFET PU-2 substantially along the direction 302. In some embodiments, the gate electrode pattern 216-2 is positioned overlying the semiconductor fin 204-2. The gate electrode pattern 216-2 may cover an end portion of the semiconductor fin 204-2, which is close to the drain of the pull-up FinFET PU-1, and the isolating feature 206 adjacent to the end portion of the semiconductor fin 204-2. In addition, the gate electrode pattern 216-2 may be aligned with the gate electrode pattern 215-2B of the pull-up FinFET PU-1 substantially along the direction 302. In should be noted that the gate electrode patterns 216-1 and 216-2 do not serve as the gate structures of the FinFET, so that the gate electrode patterns 216-1 and 216-2 may serve as a dummy gate electrode pattern.

In some embodiments, the (dummy) gate electrode pattern 216-1 is positioned beside and physically separated from the gate electrode pattern 215-2B of the pull-up FinFET PU-1. The (dummy) gate electrode pattern 216-1 may be positioned between and aligned the gate electrode pattern 215-2B of the pull-up FinFET PU-1 and the gate electrode pattern 215-6 of the pass-gate FinFET PG-2 substantially along the direction 300. In addition, the (dummy) gate electrode pattern 216-2 is positioned beside and physically separated from the gate electrode pattern 215-4B of the pull-up FinFET PU-2. The (dummy) gate electrode pattern 216-2 may be positioned between and aligned the gate electrode pattern 215-4B of the pull-up FinFET PU-2 and the gate electrode pattern 215-5 of the pass-gate FinFET PG-1 substantially along the direction 300.

In some embodiments, each of the gate electrode patterns 215-1, 215-2B, 215-3, 215-4B, 215-5, 215-6, 216-1 and 216-2 has a length L that runs substantially along direction 300 and a width W that runs substantially along direction 302. In some embodiments, the ratio of length L to width W is higher than or equal to 3. In addition, the gate electrode patterns 215-1, 215-2B, 215-3, 215-4B, 215-5, 215-6, 216-1 and 216-2 of the SRAM cell 500C (or 500D) may have the same length L and the same width W.

In some embodiments, as shown in FIG. 9, the conductive line patterns 230-1, 230-2, 230-3 and 230-4 are strip (line) shapes extending substantially along the direction 302. The conductive line patterns 230-1, 230-2, 230-3 and 230-4 are arranged in the contact/LGC (local gate connection) level shown in FIG. 4. In some embodiments, the conductive line pattern 230-1 is positioned over and overlying the pull-down FinFET PD-1, the pull-up FinFET PU-1 and the (dummy) gate electrode pattern 216-1. In addition, the conductive line pattern 230-1 is electrically connected to and in contact with the gate electrode pattern 215-1 of the pull-down FinFET PD-1, the gate electrode pattern 215-2B of the pull-up FinFET PU-1 and the (dummy) gate electrode pattern 216-1 (also shown in FIG. 10A). Therefore, the pull-down FinFET PD-1, the pull-up FinFET PU-1 and the conductive line pattern 230-1, which is configured to connect the individual gate electrode patterns of the pull-down FinFET PD-1 and the pull-up FinFET PU-1, may collectively form a first complementary metal-oxide-semiconductor (CMOS) inverter (e.g. the first inverter Inverter-1 shown in FIG. 2) of the SRAM cell 500C (or 500D). In the first inverter of the SRAM cell 500C (or 500D), the gate electrode pattern 215-1 of the pull-down FinFET PD-1 is physically separated from the gate electrode pattern 215-2B of the pull-up FinFET PU-1.

In some embodiments, the conductive line pattern 230-2 is positioned over and overlying the pull-down FinFET PD-2, the pull-up FinFET PU-2 and the (dummy) gate electrode pattern 216-2. In addition, the conductive line pattern 230-2 is electrically connected to and in contact with the gate electrode pattern 215-3 of the pull-down FinFET PD-2, the gate electrode pattern 215-4B of the pull-up FinFET PU-2 and the (dummy) gate electrode pattern 216-2. Therefore, the pull-down FinFET PD-2, the pull-up FinFET PU-2 and the conductive line pattern 230-2, which is configured to connect the individual gate electrode patterns of the pull-down FinFET PD-2 and the pull-up FinFET PU-2, may collectively form a second complementary metal-oxide-semiconductor (CMOS) inverter (e.g. the second inverter Inverter-2 shown in FIG. 2) of the SRAM cell 500C (or 500D). In the second inverter of the SRAM cell 500C (or 500D), the gate electrode pattern 215-3 of the pull-down FinFET PD-2 is physically separated from the gate electrode pattern 215-4B of the pull-up FinFET PU-2 in the second inverter of the SRAM cell 500C (or 500D).

In some embodiments, the structure, component, configuration and arrangement of the conductive line patterns 230-3 and 230-4 of the SRAM cell 500C (or 500D) may be similar to, or the same as the conductive line pattern 230-3 of the SRAM cell 500A (or 500B) shown in FIG. 5 and are not repeated herein.

In some embodiments, as shown in FIGS. 9 and 10B, the SRAM cell 500D further includes a dielectric layer 234 between any two adjacent gate electrode patterns. For example, the dielectric layer 234 is positioned between the gate electrode pattern 215-1 of the pull-down FinFET PD-1 and the gate electrode pattern 215-2B of the pull-up FinFET PU-1, between the gate electrode pattern 215-2B of the pull-up FinFET PU-1 and the (dummy) gate electrode pattern 216-1, between the gate electrode pattern 215-3 of the pull-down FinFET PD-2 and the gate electrode pattern 215-4B of the pull-up FinFET PU-2, or between the gate electrode pattern 215-4B of the pull-up FinFET PU-2 and the (dummy) gate electrode pattern 216-2. In addition, the dielectric layer 234 may be formed filling spaces between the gate electrode patterns 215-1, 215-2B, 215-3, 215-4B, 215-5, 215-6, 216-1 and 216-2 and coplanar with top surfaces of the gate electrode patterns 215-1, 215-2B, 215-3, 215-4B, 215-5, 215-6, 216-1 and 216-2. The dielectric layer 234 may be formed in the contact/LGC (local gate connection) level shown in FIG. 4 and covered by the dielectric (ILD) layer 464 and the conductive line patterns 230-1, 230-2, 230-3 and 230-4. The dielectric layer 234 may help to improve the breakdown voltage of the pass-gate FinFETs PG-1 and PG-2, the pull-up FinFETs PU-1 and PU-2, and the pull-down FinFETs PD-1 and PD-2 of the SRAM cell 500C (or 500D).

In some embodiments, the structure, component, configuration and arrangement of the conductive line patterns 230-3 and 230-4 of the SRAM cell 500C (or 500D) may be similar to, or the same as the conductive line pattern 230-3 of the SRAM cell 500A (or 500B) shown in FIG. 5 and are not repeated herein.

Figure 11:
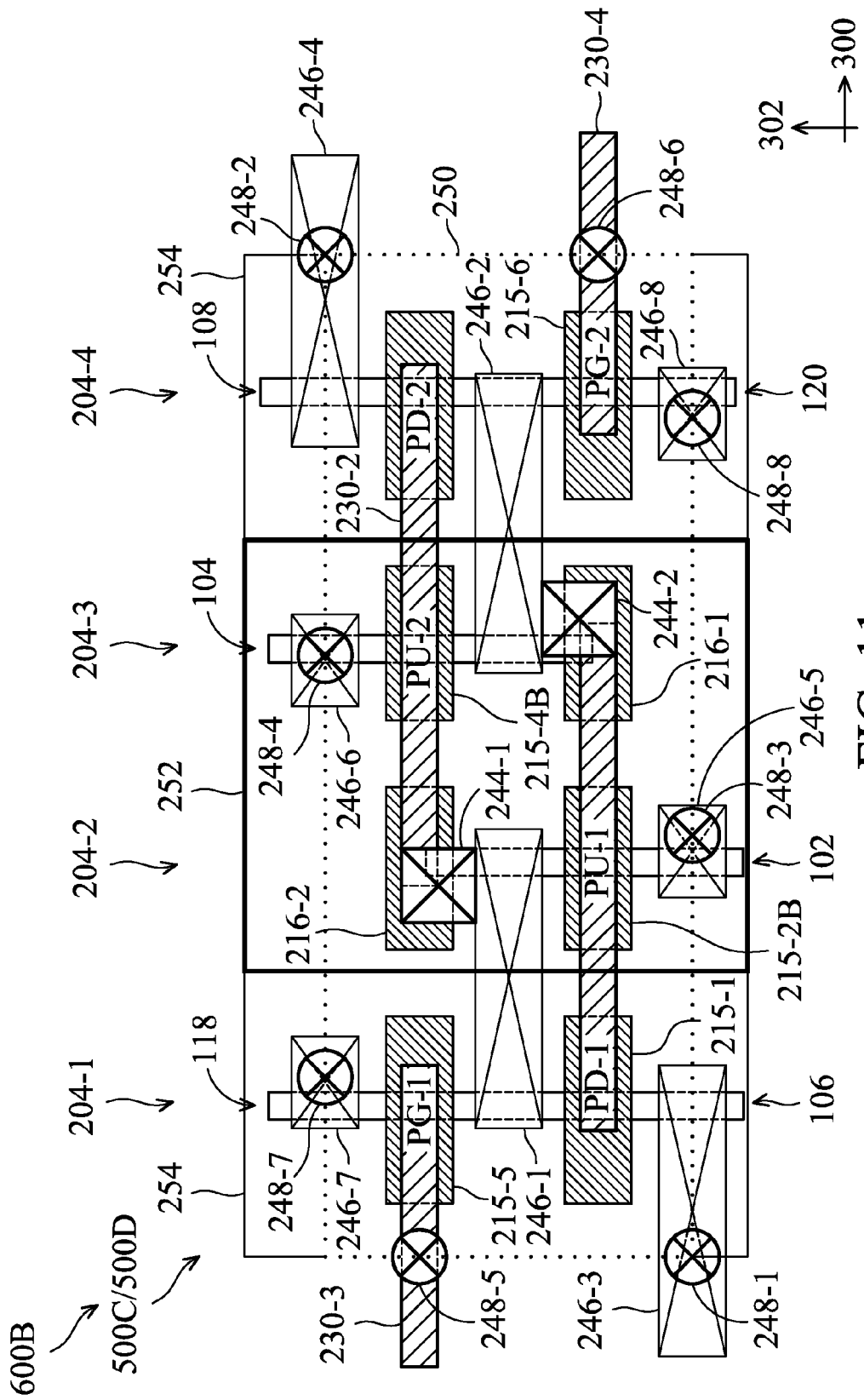
FIG. 11 illustrates a layout of an SRAM cell of an SRAM cell structure in accordance with embodiments.

FIG. 11 illustrates a layout of an SRAM cell of an SRAM cell structure in accordance with embodiments. FIG. 11 is also used to illustrate a plan view of an interconnect structure for the routing of the SRAM cell 500C (or 500D) of the SRAM cell structure 600B. FIG. 11 especially shows contacts in the active-region level and the contact/LGC (local gate connection) level. In addition, the vias in the Via_0 level overlying the contact/LGC (local gate connection) level are shown in FIG. 11. It should be noted that various levels of the interconnect structure shown in FIG. 11 is merely an example and is not intended to be limiting the actual cross-sectional view of SRAM cell 500C (or 500D).

As shown in FIG. 11, a butted contact plug (Butt-CO) 244-1 is configured to electrically connect the conductive line pattern 230-2 to the drain region of the pull-up FinFET PU-1. In other words, the Butt-CO 244-1 is configured to electrically connect the (dummy) gate electrode pattern 216-2, the gate electrode pattern 215-3 of the pull-down FinFET PD-2 and the gate electrode pattern 215-4A of the pull-up FinFET PU-2 to the drain region of the pull-up FinFET PU-1. In addition, a butted contact plug (Butt-CO) 244-2 is configured to electrically connect the conductive line pattern 230-1 to the drain region of the pull-up FinFET PU-2. In other words, the Butt-CO 244-2 is configured to electrically connect the (dummy) gate electrode pattern 216-1, the gate electrode pattern 215-1 of the pull-down FinFET PD-1 and the gate electrode pattern 215-2B of the pull-up FinFET PU-1 to the drain region of the pull-up FinFET PU-2. In some embodiments, the Butt-CO 244-1 and the Butt-CO 244-2 are formed in the contact/LGC (local gate connection) level shown in FIG. 4. In some embodiments, the Butt-CO 244-1 and the Butt-CO 244-2 have a longitudinal direction substantially along the longitudinal direction of semiconductor fins 204-1, 204-2, 204-3 and 204-4, which is substantially along the direction 302.

As shown in FIG. 11, a long contact 246-1 is configured to electrically connect the semiconductor fin 204-1 (the drain region of the pull-down FinFET PD-1) to the semiconductor fin 204-2 and the Butt-CO 244-1. Therefore, the long contact 246-1 and the Butt-CO 244-1 form the storage node 112 (also refer to FIG. 1). In addition, a long contact 246-2 is configured to electrically connect the semiconductor fin 204-4 (the drain region of the pull-down FinFET PD-2) to the semiconductor fin 204-3 and the Butt-CO 244-2. Therefore, the long contact 246-2 and the Butt-CO 244-2 form the storage node 110 (also refer to FIG. 1). In some embodiments, the long contacts 246-1 and 246-2 are formed in the contact/LGC (local gate connection) level shown in FIG. 4. In some embodiments, the long contacts 246-1 and 246-2 have a longitudinal direction substantially along the direction 300 and perpendicular to the longitudinal direction of semiconductor fins 204-1, 204-2, 204-3 and 204-4, which is substantially along the direction 302. In the manufacturing of the SRAM cell 500C (or 500D) on physical semiconductor wafers, the Butt-CO 244-1 and the long contact 246-1 may be formed as a single continuous butted contact plug. Similarly, the Butt-CO 244-2 and the long contact 246-2 may be formed as a single continuous butted contact plug.

As shown in FIG. 11, a long contact 246-3 is configured to electrically connect the semiconductor fin 204-1 (the source region of the pull-down FinFET PD-1) to a via 248-1 in the Via_0 level. Therefore, the long contact 246-3 and the via 248-1 form the CVss-nodes 106 (also refer to FIG. 1). In addition, a long contact 246-4 is configured to electrically connect the semiconductor fin 204-4 (the source region of the pull-down FinFET PD-2) to a via 248-2 in the Via_0 level. Therefore, the long contact 246-4 and the via 248-2 form the CVss-nodes 108 (also refer to FIG. 1).

As shown in FIG. 11, a long contact 246-5 is configured to electrically connect the semiconductor fin 204-2 (the source region of the pull-up FinFET PU-1) to a via 248-3 in the Via_0 level. Therefore, the long contact 246-5 and the via 248-3 form the CVdd-node 102 (also refer to FIG. 1). In addition, a long contact 246-6 is configured to electrically connect the semiconductor fin 204-3 (the source region of the pull-up FinFET PU-2) to a via 248-4 in the Via_0 level. Therefore, the long contact 246-6 and the via 248-4 form the CVdd-node 104 (also refer to FIG. 1).

As shown in FIG. 11, a via 248-5 is configured to electrically connect the underlying conductive line pattern 230-3. In other words, the via 248-5 may serve as a word line via, which electrically connect the gate electrode pattern 215-5 of the pass-gate FinFET PG-1. In addition, a via 248-6 is configured to electrically connect the underlying conductive line pattern 230-4. In other words, the via 248-6 may serve as a word line via, which electrically connect the gate electrode pattern 215-6 of the pass-gate FinFET PG-2.

As shown in FIG. 11, a long contact 246-7 is configured to electrically connect the semiconductor fin 204-1 (the source region of the pass-gate FinFET PG-1) to a via 248-7 in the Via_0 level. Therefore, the long contact 246-7 and the via 248-7 form the bit-line node 118 (also refer to FIG. 1). In addition, a long contact 246-8 is configured to electrically connect the semiconductor fin 204-4 (the source region of the pass-gate FinFET PG-2) to a via 248-8 in the Via_0 level. Therefore, the long contact 246-8 and the via 248-8 form the bit-line bar node 120 (also refer to FIG. 1).

FIG. 8 also illustrates a layout of back-end features of the SRAM cell 500C (or 500D) of the SRAM cell structure 600B in accordance with embodiments. The back-end features include the vias at the Via_0 level and the Via_1 level, and the metal lines in the M1 level and the M2 level. In some embodiments, the arrangement of the vias at the Via_0 level and the Via_1 level, and the arrangement of the metal lines in the M1 level and the M2 level may be similar to, or the same as the SRAM cell 500A (or 500B) and are not repeated herein.

In some embodiments, the SRAM cell structure 600B includes a plurality of SRAM cells 500C (or 500D) arranged in an array. Each of the SRAM cells 500C (or 500D) includes four semiconductor fins (e.g. the semiconductor fins 204-1, 204-2, 204-3 and 204-4), eight separated gate electrode patterns (e.g. the gate electrode patterns 215-1, 215-2B, 215-3, 215-4B, 215-5 and 215-6, which serve as the gate structure of the pass-gate FinFETs PG-1 and PG-2, the pull-up FinFETs PU-1 and PU-2 and the pull-down FinFETs PD-1 and PD-2, and gate electrode patterns 216-1 and 216-2, which serve as the dummy gate electrode patterns) and four conductive line patterns (e.g. the conductive line patterns 230-1, 230-2, 230-3 and 230-4) overlying the gate electrode patterns. In the SRAM cell 500C (or 500D), the gate electrode pattern 215-2B of the pull-up FinFET PU-1 and the dummy gate electrode pattern 216-2 are formed on the same semiconductor fin 204-2. The gate electrode pattern 215-4B of the pull-up FinFET PU-2 and the dummy gate electrode pattern 216-1 may be formed on the same semiconductor fins 204-3. In addition, the gate electrode pattern 215-2B of the pull-up FinFET PU-1 may be aligned with the dummy gate electrode pattern 216-2 along the direction 302. Furthermore, the gate electrode pattern 215-4B of the pull-up FinFET PU-2 may be aligned with the dummy gate electrode pattern 216-1 along the direction 302. In some embodiments, the gate electrode patterns 215-1, 215-2B, 215-3, 215-4B, 215-5, 215-6, 216-1 and 216-2 have the same or similar dimensions (including a length L that runs substantially along direction 300 and a width W that runs substantially along direction 302).

In some embodiments, the gate electrode pattern 215-1 of the pull-down FinFET PD-1, the gate electrode pattern 215-2B of the pull-up FinFET PU-1 and the gate electrode pattern 216-1 positioned overlying the semiconductor fin 204-3, which are separated from each other, are connected to the overlying conductive line pattern 230-1 (at the contact/LGC level). The gate electrode pattern 215-3 of the pull-down FinFET PD-2, the gate electrode pattern 215-4B of the pull-up FinFET PU-2 and the gate electrode pattern 216-2 positioned overlying the semiconductor fin 204-2, which are separated from each other, may be connected to the overlying conductive line pattern 230-2 (at the contact/LGC level). The conductive line patterns 230-3 may be electrically connected to the underlying gate electrode pattern 215-5 of the pass-gate FinFET PG-1 and may extend outside the boundary 250 of the SRAM cells 500C (or 500D) along the direction 300. In addition, the conductive line pattern 230-4 may be electrically connected to the underlying gate electrode pattern 215-6 of the pass-gate FinFET PG-2 and may extend outside the boundary 250 of the SRAM cells 500C (or 500D) along the direction 300. In the SRAM cell 500C (or 500D) of the SRAM cell structure 600B, the gate electrode patterns of the FinFETs on different semiconductor fins are physically separated from each other and have the same or similar dimensions. In addition, each of the semiconductor fins may have the same amount of gate electrode patterns formed thereon by the arrangement of the dummy gate electrode patterns. Therefore, the SRAM cell 500C (or 500D) of the SRAM cell structure 600B shows a regular pattern arrangement in the gate electrode patterns of the FinFETs. Furthermore, some of the separated gate electrode patterns can be connected by the overlying additional conductive line patterns to form the electrical connections between the gate electrode patterns of FinFETs, for example, between the pull-down FinFET PD-1 and the pull-up FinFET PU-1 or between the pull-down FinFET PD-2 and the pull-up FinFET PU-2. Therefore, the performance (e.g. the short channel leakage, turn-on current (Ion) degradation and the reliability of gate to contact bridge) of the SRAM cells 500C (or 500D) of the SRAM cell structure 600B can be improved.

As described previously, embodiments of a static random access memory (SRAM) cell (e.g. the SRAM cells 500A, 500B, 500C and 500D) and a static random access memory (SRAM) cell structure (e.g. the SRAM structures 600A and 600B) are provided. The SRAM cell includes a first inverter (e.g. the first inverter Inverter-1) and a second inverter (e.g. the second inverter Inverter-2) cross-latched with the first inverter. The first inverter includes a first pull-down fin field-effect transistor (FinFET) PD-1, a first pull-up FinFET PU-1 and a first conductive line pattern 230-1. A first gate electrode pattern (e.g. the gate electrode pattern 215-1) of the first pull-down FinFET PD-1 is physically separated from a second gate electrode pattern (e.g. the gate electrode pattern 215-2A and the gate electrode pattern 215-2B) of the first pull-up FinFET PU-1. The first conductive line pattern (e.g. the conductive line pattern 230-1) is positioned over and electrically connected to the first gate electrode pattern of the first pull-down FinFET PD-1 and second gate electrode pattern of the first pull-up FinFET PU-1. The second inverter includes a second pull-down FinFET PD-2, a second pull-up FinFET PU-2 and a second conductive line pattern (e.g. the conductive line pattern 230-2). A third gate electrode pattern (e.g. the gate electrode pattern 215-3) of the second pull-down FinFET PD-2 is physically separated from a fourth gate electrode pattern (e.g. the gate electrode pattern 215-4A and the gate electrode pattern 215-4B) of the second pull-up FinFET PU-2. The second conductive line pattern is positioned over and electrically connected to the third gate electrode pattern of the second pull-down FinFET PD-2 and the fourth gate electrode pattern the second pull-up FinFET PU-2. The SRAM cell further includes first pass-gate FinFET PG-1 and a second pass-gate FinFET PG-2. The first pass-gate FinFET PG-1 having a fifth gate electrode pattern (e.g. the gate electrode pattern 215-5) is connected to drains of the first pull-up FinFET PU-1 and the first pull-down FinFET PD-1. The second pass-gate FinFET PG-2 having a sixth gate electrode pattern (e.g. the gate electrode pattern 215-6) is connected to drains of the second pull-up FinFET PU-2 and the second pull-down FinFET PD-2. In the SRAM cell, the first gate electrode pattern to the first pull-down FinFET PD-1 is designed to be physically separated from the second gate electrode pattern of the first pull-up FinFET PU-1. In addition, the third gate electrode pattern of the second pull-down FinFET PD-2 is designed to be physically separated from the fourth gate electrode pattern of the second pull-up FinFET PU-2. The gate electrode patterns of the SRAM cell of the SRAM cell structure on different semiconductor fins are physically separated from each other. In addition, the ends of the gate electrode patterns on the same semiconductor fin may be aligned with each other substantially along the longitudinal direction of semiconductor fin (e.g. the direction 302). Furthermore, the gate electrode patterns may have the same or similar dimensions. Therefore, the gate electrode patterns of the SRAM cell of the SRAM cell structure shows a regular pattern arrangement. Furthermore, some of the separated gate electrode patterns can be connected by the overlying additional conductive line patterns to form the electrical connections between the gate electrode patterns of FinFETs, which are configured to form the inverters of the SRAM cell. Therefore, the performance (e.g. the short channel leakage, turn-on current (Ion) degradation and the reliability of gate to contact bridge) of the SRAM cell of the SRAM cell structure can be improved due to the improved device matching.

Embodiments of a static random access memory (SRAM) cell and a SRAM cell structure are provided. The SRAM cell includes a first pull-down transistor, a first pull-up transistor, a second pull-down transistor, a second pull-up transistor, a first conductive line pattern and a second conductive line pattern. A first gate electrode pattern of the first pull-down transistor and a second gate electrode pattern of the first pull-up transistor are physically separated from each other and electrically connected to the first conductive line pattern. The second inverter includes a second pull-down transistor, a second pull-up transistor and a second conductive line pattern. A third gate electrode pattern of the second pull-down transistor and a fourth gate electrode pattern of the second pull-up transistor are physically separated from each other and electrically connected to the second conductive line pattern. The gate electrode patterns of the SRAM cell of the SRAM cell structure on different semiconductor fins are physically separated from each other and have the same or similar dimensions. Therefore, the gate electrode patterns of the SRAM cell of the SRAM cell structure shows a regular pattern arrangement.

In some embodiments, a static random access memory (SRAM) cell is provided. The SRAM cell includes a first inverter and a second inverter cross-latched with the first inverter. The first inverter includes a first pull-down transistor, a first pull-up transistor and a first conductive line pattern. A first gate electrode pattern of the first pull-down transistor is physically separated from a second gate electrode pattern of the first pull-up transistor. The first conductive line pattern is positioned over and electrically connected to the first gate electrode pattern of the first pull-down transistor and second gate electrode pattern of the first pull-up transistor. The second inverter includes a second pull-down transistor, a second pull-up transistor and a second conductive line pattern. A third gate electrode pattern of the second pull-down transistor is physically separated from a fourth gate electrode pattern of the second pull-up transistor. The second conductive line pattern is positioned over and electrically connected to the third gate electrode pattern of the second pull-down transistor and the fourth gate electrode pattern the second pull-up transistor. The SRAM cell further includes first pass-gate transistor and a second pass-gate transistor. The first pass-gate transistor has a fifth gate electrode pattern. The first pass-gate transistor is connected to drains of the first pull-up transistor and the first pull-down transistor. The second pass-gate transistor has a sixth gate electrode pattern. The second pass-gate transistor is connected to drains of the second pull-up transistor and the second pull-down transistor.

In some embodiments, a static random access memory (SRAM) cell structure is provided. The SRAM cell structure includes a plurality of SRAM cells. Each of the SRAM cells includes a first inverter and a second inverter cross-latched with the first inverter. The first inverter includes a first pull-down Fin field-effect transistor (FinFET), a first pull-up FinFET, a first dummy gate electrode pattern and a first conductive line pattern. A first gate electrode pattern of the first pull-down FinFET is physically separated from a second gate electrode pattern of the first pull-up FinFET. The first dummy gate electrode pattern is positioned beside the second gate electrode pattern of the first pull-up FinFET and physically separated from the first gate electrode pattern of the first pull-down FinFET and the second gate electrode pattern of the first pull-up FinFET. The first conductive line pattern is electrically connected to the first gate electrode pattern of the first pull-down FinFET, the second gate electrode pattern of the first pull-up FinFET and the first dummy gate electrode pattern. The second inverter includes a second pull-down FinFET, a second pull-up FinFET, a second dummy gate electrode pattern and a second conductive line pattern. A third gate electrode pattern of the second pull-down FinFET is physically separated from a fourth gate electrode pattern of the second pull-up FinFET. The second dummy gate electrode pattern is positioned beside the fourth gate electrode pattern of the second pull-up FinFET and physically separated from the third gate electrode pattern of the second pull-down FinFET and the fourth gate electrode pattern of the second pull-up FinFET. The second conductive line pattern is electrically connected to the third gate electrode pattern of the second pull-down FinFET, the fourth gate electrode pattern of the second pull-up FinFET and the second dummy gate electrode pattern. The SRAM cell further includes a first pass-gate FinFET having a fifth gate electrode pattern. The first pass-gate FinFET is connected to drains of the first pull-up FinFET and the first pull-down FinFET. The SRAM cell further includes a second pass-gate FinFET having a sixth gate electrode pattern. The second pass-gate FinFET is connected to drains of the second pull-up FinFET and the second pull-down FinFET.

In some embodiments, a static random access memory (SRAM) cell is provided. The static random access memory (SRAM) cell includes a first inverter and a second inverter cross-latched with the first inverter. The first inverter includes a first pull-down fin field-effect transistor (FinFET), a first pull-up FinFET and a first conductive line pattern. A first gate electrode pattern of the first pull-down FinFET is physically separated from a second gate electrode pattern of the first pull-up FinFET by a high dielectric constant (high-k) dielectric layer. The high-k dielectric layer has a dielectric constant (k) that is higher than that of silicon dioxide. The first conductive line pattern is positioned over and electrically connected to the first gate electrode pattern of the first pull-down FinFET and the second gate electrode pattern of the first pull-up FinFET. The second inverter includes a second pull-down FinFET, a second pull-up FinFET and a second conductive line pattern. A third gate electrode pattern of the second pull-down FinFET is physically separated from a fourth gate electrode pattern of the second pull-up FinFET by the high-k dielectric layer. The second conductive line pattern is positioned over and electrically connected to the third gate electrode pattern of the second pull-down FinFET and the fourth gate electrode pattern of the second pull-up FinFET. The SRAM cell further includes a first pass-gate FinFET and a second pass-gate FinFET. The first pass-gate FinFET having a fifth gate electrode pattern is connected to drains of the first pull-up FinFET and the first pull-down FinFET. The second pass-gate FinFET having a sixth gate electrode pattern is connected to drains of the second pull-up FinFET and the second pull-down FinFET.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) cell, comprising:
   a first inverter comprising:
      a first pull-down transistor and a first pull-up transistor, wherein a first gate electrode pattern of the first pull-down transistor is physically separated from a second gate electrode pattern of the first pull-up transistor; and
      a first conductive line pattern over and electrically connected to the first gate electrode pattern of the first pull-down transistor and the second gate electrode pattern of the first pull-up transistor;
   a second inverter cross-latched with the first inverter, wherein the second inverter comprises:
      a second pull-down transistor and a second pull-up transistor, wherein a third gate electrode pattern of the second pull-down transistor is physically separated from a fourth gate electrode pattern of the second pull-up transistor; and
      a second conductive line pattern over and electrically connected to the third gate electrode pattern of the second pull-down transistor and the fourth gate electrode pattern of the second pull-up transistor;
   a first pass-gate transistor having a fifth gate electrode pattern and connected to a drain of the first pull-up transistor and a drain of the first pull-down transistor; and
   a second pass-gate transistor having a sixth gate electrode pattern and connected to a drain of the second pull-up transistor and a drain of the second pull-down transistor.

2. The SRAM cell as claimed in claim 1, wherein the first conductive line pattern is positioned overlying and in contact with the first gate electrode pattern of the first pull-down transistor and the second gate electrode pattern of the first pull-up transistor, wherein the second conductive line pattern is positioned overlying and in contact with the third gate electrode pattern of the second pull-down transistor and the fourth gate electrode pattern of the second pull-up transistor.

3. The SRAM cell as claimed in claim 1, further comprising:
   a third conductive line pattern over the first pass-gate transistor, wherein the third conductive line pattern is electrically connected to the fifth gate electrode pattern of the first pass-gate transistor and extends outside a boundary of the SRAM cell; and
   a fourth conductive line pattern over the second pass-gate transistor, wherein the fourth conductive line pattern is electrically connected to the sixth gate electrode pattern of the second pass-gate transistor and extends outside the boundary of the SRAM cell.

4. The SRAM cell as claimed in claim 1, further comprising:
   a first semiconductor fin, a second semiconductor fin, a third semiconductor fin and a fourth semiconductor fin arranged along a first direction and extending along a second direction,
   wherein the first gate electrode pattern of the first pull-down transistor and the fifth gate electrode pattern of the first pass-gate transistor are positioned overlying the first semiconductor fin,
   wherein the second gate electrode pattern of the first pull-up transistor is positioned overlying the second semiconductor fin,
   wherein the third gate electrode pattern of the second pull-down transistor and the sixth gate electrode pattern of the second pass-gate transistor are positioned overlying the fourth semiconductor fin, and
   wherein the fourth gate electrode pattern of the second pull-up transistor is positioned overlying the third semiconductor fin.

5. The SRAM cell as claimed in claim 4, wherein the second gate electrode pattern of the first pull-up transistor is positioned between the first gate electrode pattern of the first pull-down transistor and the sixth gate electrode pattern of the second pass-gate transistor along the first direction, wherein the fourth gate electrode pattern of the second pull-up transistor is positioned between the third gate electrode pattern of the second pull-down transistor and the fifth gate electrode pattern of the first pass-gate transistor along the first direction.

6. The SRAM cell as claimed in claim 4, further comprising:
   a first dummy gate electrode pattern positioned overlying an end of the second semiconductor fin and electrically connected to the first conductive line pattern; and
   a second dummy gate electrode pattern positioned overlying an end of the third semiconductor fin and electrically connected to the second conductive line pattern.

7. The SRAM cell as claimed in claim 6, wherein the first dummy gate electrode pattern is positioned between the second gate electrode pattern of the first pull-up transistor and the sixth gate electrode pattern of the second pass-gate transistor, wherein the second dummy gate electrode pattern is positioned between the fourth gate electrode pattern of the second pull-up transistor and the fifth gate electrode pattern of the first pass-gate transistor.

8. The SRAM cell as claimed in claim 1, further comprising:
   a dielectric layer positioned between the first gate electrode pattern of the first pull-down transistor and the second gate electrode pattern of the first pull-up transistor or between the third gate electrode pattern of the second pull-down transistor and the fourth gate electrode pattern of the second pull-up transistor, wherein a dielectric constant of the dielectric layer is greater than 5.

9. The SRAM cell as claimed in claim 3, further comprising:
a bit line (BL) conductive pattern electrically connected to a source of the first pass-gate transistor; and
a complementary bit-line (BLB) conductive pattern electrically connected to a source of the second pass-gate transistor;
a power supply voltage (VSS) conductive pattern electrically connected to sources of the first pull-down transistor and the second pull-down transistor;
a positive power supply voltage (Vdd) conductive pattern electrically connected to sources of the first pull-up transistor and the second pull-up transistor; and
a word-line (WL) conductive pattern electrically connected to the third conductive line pattern and the fourth conductive line pattern.

10. The SRAM cell as claimed in claim 4, wherein the first gate electrode pattern of the first pull-down transistor, the second gate electrode pattern of the first pull-up transistor, the third gate electrode pattern of the second pull-down transistor and the fourth gate electrode pattern of the second pull-up transistor each extends along the first direction and each has a length along the first direction and a width along the second direction, and a ratio of the length to the width is greater than or equal to 3.

11. A Static Random Access Memory (SRAM) cell structure, comprising:
a plurality of SRAM cells, each of the SRAM cells comprising:
a first inverter and a second inverter cross-latched with the first inverter, wherein the first inverter comprises:
a first pull-down fin field-effect transistor (FinFET) and a first pull-up FinFET, wherein a first gate electrode pattern of the first pull-down FinFET is physically separated from a second gate electrode pattern of the first pull-up FinFET;
a first dummy gate electrode pattern beside the second gate electrode pattern of the first pull-up FinFET and physically separated from the first gate electrode pattern of the first pull-down FinFET and the second gate electrode pattern of the first pull-up FinFET; and
a first conductive line pattern electrically connected to the first gate electrode pattern of the first pull-down FinFET, the second gate electrode pattern of the first pull-up FinFET and the first dummy gate electrode pattern;
wherein the second inverter comprises:
a second pull-down FinFET and a second pull-up FinFET, wherein a third gate electrode pattern of the second pull-down FinFET is physically separated from a fourth gate electrode pattern of the second pull-up FinFET;
a second dummy gate electrode pattern beside the fourth gate electrode pattern of the second pull-up FinFET and physically separated from the third gate electrode pattern of the second pull-down FinFET and the fourth gate electrode pattern of the second pull-up FinFET; and
a second conductive line pattern electrically connected to the third gate electrode pattern of the second pull-down FinFET, the fourth gate electrode pattern of the second pull-up FinFET and the second dummy gate electrode pattern;

a first pass-gate FinFET having a fifth gate electrode pattern, connected to a drain of the first pull-up FinFET and a drain of the first pull-down FinFET; and
a second pass-gate FinFET having a sixth gate electrode pattern, connected to a drain of the second pull-up FinFET and a drain of the second pull-down FinFET.

12. The SRAM cell structure as claimed in claim 11, wherein the plurality of SRAM cells is arranged in an array comprising a plurality of rows and a plurality of columns, wherein each of the SRAM cells further comprises:
a third conductive line pattern over the first pass-gate FinFET and electrically connected to the fifth gate electrode patterns of the first pass-gate FinFETs of the two adjacent SRAM cells; and
a fourth conductive line pattern over the second pass-gate FinFET and electrically connected to the sixth gate electrode patterns of the second pass-gate FinFETs of the two adjacent SRAM cells.

13. The SRAM cell structure as claimed in claim 12, wherein the fifth gate electrode patterns of the first pass-gate FinFETs of the two adjacent SRAM cells are physically separated from each other, wherein the sixth gate electrode patterns of the second pass-gate FinFETs of the two adjacent SRAM cells are physically separated from each other.

14. The SRAM cell structure as claimed in claim 11, further comprising:
a first semiconductor fin, a second semiconductor fin, a third semiconductor fin and a fourth semiconductor fin arranged along a first direction and extending along a second direction,
wherein the first gate electrode pattern of the first pull-down FinFET and the fifth gate electrode pattern of the first pass-gate FinFET are positioned overlying the first semiconductor fin, and
wherein the third gate electrode pattern of the second pull-down FinFET and the sixth gate electrode pattern of the second pass-gate FinFET are positioned overlying the fourth semiconductor fin,
wherein the second gate electrode pattern of the first pull-up FinFET and the second dummy gate electrode pattern are positioned overlying the second semiconductor fin,
wherein the fourth gate electrode pattern of the second pull-up FinFET and the first dummy gate electrode pattern are positioned overlying the third semiconductor fin.

15. The SRAM cell structure as claimed in claim 11, further comprising:
a dielectric layer positioned between the first gate electrode pattern of the first pull-down FinFET and the second gate electrode pattern of the first pull-up FinFET or between the third gate electrode pattern of the second pull-down FinFET and the fourth gate electrode pattern of the second pull-up FinFET, wherein a dielectric constant of the dielectric layer is greater than 5.

16. The SRAM cell structure as claimed in claim 14, wherein the first gate electrode pattern of the first pull-down FinFET, the second gate electrode pattern of the first pull-up FinFET, the third gate electrode pattern of the second pull-down FinFET, the fourth gate electrode pattern of the second pull-up FinFET, the fifth gate electrode pattern of the first pass-gate FinFET, the sixth gate electrode pattern of the second pass-gate FinFET, the first dummy gate electrode pattern and the second dummy gate electrode pattern have the same length along the first direction and have the same width along the second direction, and the ratio of the length to the width is greater than or equal to 3.

17. A Static Random Access Memory (SRAM) cell, comprising:
   a first inverter comprising:
      a first pull-down fin field-effect transistor (FinFET) and a first pull-up FinFET, wherein a first gate electrode pattern of the first pull-down FinFET is physically separated from a second gate electrode pattern of the first pull-up FinFET by a high dielectric constant (high-k) dielectric layer, wherein the high-k dielectric layer has a dielectric constant (k) that is higher than that of silicon dioxide; and
      a first conductive line pattern over and electrically connected to the first gate electrode pattern of the first pull-down FinFET and the second gate electrode pattern of the first pull-up FinFET;
   a second inverter cross-latched with the first inverter, wherein the second inverter comprises:
      a second pull-down FinFET and a second pull-up FinFET, wherein a third gate electrode pattern of the second pull-down FinFET is physically separated from a fourth gate electrode pattern of the second pull-up FinFET by the high-k dielectric layer; and
      a second conductive line pattern over and electrically connected to the third gate electrode pattern of the second pull-down FinFET and the fourth gate electrode pattern of the second pull-up FinFET;
   a first pass-gate FinFET having a fifth gate electrode pattern, connected to a drain of the first pull-up FinFET and a drain of the first pull-down FinFET; and
   a second pass-gate FinFET having a sixth gate electrode pattern, connected to a drain of the second pull-up FinFET and a drain of the second pull-down FinFET.

18. The SRAM cell as claimed in claim 17, wherein the high-k dielectric layer is formed of hafnium oxide, zirconium oxide, aluminum oxide, silicon nitride, silicon oxynitride, hafnium dioxide-alumina alloy, hafnium silicon oxide, hafnium silicon oxynitride, hafnium tantalum oxide, hafnium titanium oxide, hafnium zirconium oxide or a combination thereof.

19. The SRAM cell as claimed in claim 17, wherein the first gate electrode pattern of the first pull-down FinFET, the second gate electrode pattern of the first pull-up FinFET, the third gate electrode pattern of the second pull-down FinFET, the fourth gate electrode pattern of the second pull-up FinFET, the fifth gate electrode pattern of the first pass-gate FinFET and the sixth gate electrode pattern of the second pass-gate FinFET each comprises a gate dielectric layer formed of a material that is the same as the materials of the high-k dielectric layer.

20. The SRAM cell as claimed in claim 17, further comprising:
   a first dummy gate electrode pattern between the second gate electrode pattern of the first pull-up FinFET and the sixth gate electrode pattern of the second pass-gate FinFET; and
   a second dummy gate electrode pattern between the fourth gate electrode pattern of the second pull-up FinFET and the fifth gate electrode pattern of the first pass-gate FinFET,
   wherein the first conductive line pattern is electrically connected to the first gate electrode pattern of the first pull-down FinFET, the second gate electrode pattern of the first pull-up FinFET and the first dummy gate electrode pattern,
   wherein the second conductive line pattern is electrically connected to the third gate electrode pattern of the second pull-down FinFET, the fourth gate electrode pattern of the second pull-up FinFET and the second dummy gate electrode pattern.

* * * * *